United States Patent
Miller

(10) Patent No.: US 7,388,404 B1
(45) Date of Patent: Jun. 17, 2008

(54) DRIVER CIRCUIT THAT LIMITS THE VOLTAGE OF A WAVE FRONT LAUNCHED ONTO A TRANSMISSION LINE

(75) Inventor: William Edward Miller, Los Gatos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 34 days.

(21) Appl. No.: 11/493,413

(22) Filed: Jul. 26, 2006

(51) Int. Cl.
 *H03K 19/0175* (2006.01)
(52) U.S. Cl. .......................................... 326/82; 326/31
(58) Field of Classification Search ................. 326/31, 326/33, 34, 82, 83, 86, 17, 27, 87; 327/143
See application file for complete search history.

(56) References Cited

U.S. PATENT DOCUMENTS

| | | | | |
|---|---|---|---|---|
| 5,166,555 A | * | 11/1992 | Kano ........................... | 326/87 |
| 5,455,521 A | * | 10/1995 | Dobbelaere .................. | 326/17 |
| 5,717,343 A | * | 2/1998 | Kwong ........................ | 326/27 |
| 6,069,511 A | | 5/2000 | Mohan ........................ | 327/171 |
| 6,486,698 B2 | | 11/2002 | Yanagawa .................... | 326/30 |
| 6,573,747 B2 | | 6/2003 | Radhakrishnan ............. | 326/30 |
| 6,624,704 B1 | | 9/2003 | Varadarajan et al. ........ | 330/311 |
| 6,828,820 B2 | | 12/2004 | Ohno .......................... | 326/30 |
| 6,836,144 B1 | | 12/2004 | Bui et al. ..................... | 326/32 |
| 6,967,501 B1 | | 11/2005 | Butka .......................... | 326/30 |
| 2006/0170467 A1 | * | 8/2006 | Messager .................... | 327/143 |

OTHER PUBLICATIONS

Thomas F. Knight, Jr. and Alexander Krymm, "A Self-Terminating Low-Voltage Swing CMOS Output Driver", IEEE Journal of Solid-State Circuits, vol. 23, No. 2, Apr. 1998, pp. 457-464.

Mark C. Kohalmy, "An Adaptive Device Impedance Matching Circuit", VLSI Test Symposium, 1991, 'Chip-To-System Test Concerns For The 90's', Digest of Papers 7.2, Apr. 15-17, 1991, pp. 123-127.

Hitesh N. Patel, et al., "An Adaptive CMOS Transmission Line Driver", Sixth Annual IEEE ASIC Conference and Exhibit, 1993, Sep. 27-Oct. 1, 1993, pp. 460-463.

* cited by examiner

*Primary Examiner*—Rexford Barnie
*Assistant Examiner*—Crystal L Hammond
(74) *Attorney, Agent, or Firm*—Mark C. Pickering

(57) ABSTRACT

A driver circuit limits the magnitude of the initial wave front launched onto a transmission line to a voltage that is approximately one-half of the supply voltage. Thus, immediately after the initial wave front is reflected from an open circuit receiver, a voltage at the receiver is approximately equal to the supply voltage when a rising voltage is launched, and ground when a falling voltage is launched.

29 Claims, 15 Drawing Sheets

DRIVER CIRCUIT THAT LIMITS THE VOLTAGE OF A WAVE FRONT LAUNCHED ONTO A TRANSMISSION LINE

BACKGROUND-OF THE INVENTION

1. Field of the Invention

The present invention relates to driver circuits and, more particularly, to a driver on an integrated circuit that limits the voltage of a wave front launched onto a transmission line.

2. Description of the Related Art

Digital chips on a printed circuit board communicate with each other by sending and receiving streams of data across conductive traces, known as interconnects, which electrically connect the chips together. Common examples of interconnects include strip lines, microstrips, and cables which have conductors. A stream of data includes a sequence of logic highs and logic lows. A logic high is typically represented by a high voltage, while a logic low is typically represented by ground.

Recently, the time required for a signal to transition from a logic low to a logic high, known as the rise time, and the time required for a signal to transition from a logic high to a logic low, known as the fall time, has been significantly reduced. These reductions in rise and fall times, however, have significantly changed the way that the interconnects operate when transferring data from one chip to another chip.

Historically, the rise and fall times were relatively long with respect to the delay time required for a signal to propagate along an interconnect from one chip to another chip. As a result, an interconnect was typically modeled as a lumped capacitive load. More recently, however, with the reduced rise and fall times, the interconnects no longer respond as lumped capacitive loads, but instead now respond as transmission lines.

When a driver outputs a signal onto a transmission line, the voltage of the initial wave front is defined by a voltage divider using the source voltage, the source impedance, and the transmission line impedance as:

$$Vi = Vs(Z_0/Z_0+Zs)$$

where Vi is the voltage of the initial wave front, Vs is the voltage of the driver, $Z_0$ is the characteristic impedance of the transmission line, and Zs is the output impedance of the driver.

For example, assume that a driver has a voltage of 5V and an output impedance of 25Ω. In addition, further assume that the transmission line has a characteristic impedance of 75Ω. In this example, the initial voltage of the wave front output from the driver has a magnitude of 3.75V=(5*(75/75+25).

When the input impedance of a receiver connected to the transmission line is different from the characteristic impedance of the transmission line, an impedance discontinuity is present. When an impedance discontinuity exists, some portion of the initial wave front is reflected from the receiver back to the driver. The amount of the initial wave front that is reflected back to the driver is defined by a reflection coefficient as:

$$\rho = Zt - Z_0/Zt + Z_0$$

where ρ is the reflection coefficient, Zt is the impedance of the discontinuity, and $Z_0$ is the characteristic impedance of the transmission line.

Thus, when the initial wave front hits a discontinuity at the receiver input, a voltage Viρ is reflected back from the receiver to the driver. As a result, immediately following the reflection, the total magnitude of the voltage on the transmission line at the input of the receiver is Vi+Viρ.

When a receiver input is shorted, the impedance of the discontinuity Zt is equal to zero. As a result, the reflection coefficient ρ is equal to −1 regardless of the value of the characteristic impedance $Z_0$ of the transmission line. In this case, all of the initial wave front is reflected back negatively. As a result, the voltage seen by the input of the receiver is equal to Vi−Vi, or zero, immediately after the wave front has been reflected.

When a receiver input appears to be an open load, the impedance of the discontinuity Zt is equal to infinity. As a result, the reflection coefficient ρ is equal to +1 regardless of the value of the characteristic impedance $Z_0$ of the transmission line. In this case, when an open load is present, all of the initial wave front is reflected back positively. As a result, the voltage seen by the input of the receiver is equal to Vi+Vi, or 2 Vi, immediately after the wave front has been reflected.

In many cases, however, the receiver can not handle a voltage of 2 Vi. In the above example, if the initial wave front has a voltage of 3.75V, then the input of the receiver will see a voltage of 7.5V immediately following the reflection. As a result, there is a need for a circuit that prevents the receiver from experiencing a large voltage due to a reflected wave front.

DETAILED DESCRIPTION OF THE INVENTION

Figure 1:
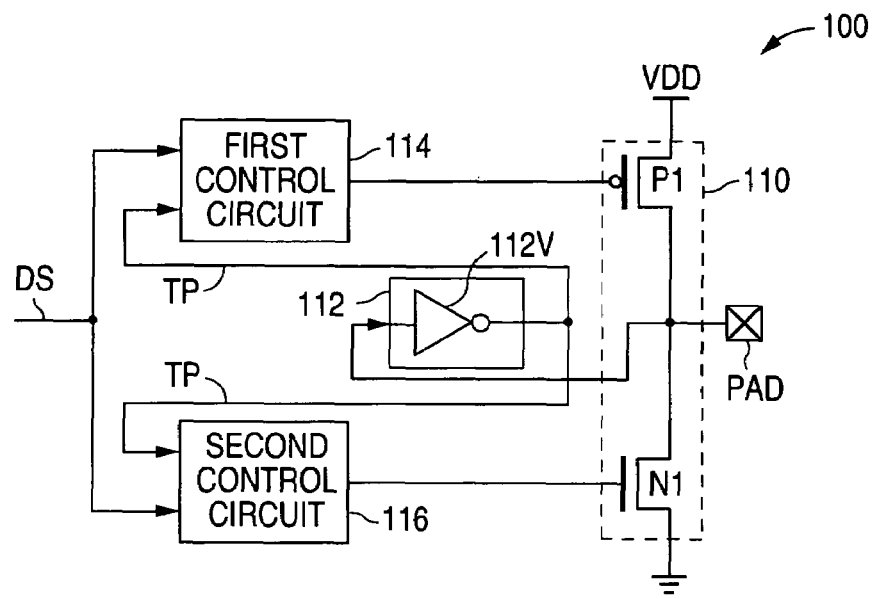
FIG. 1 is a block diagram illustrating an example of a driver circuit 100 in accordance with the present invention.

FIG. 1 shows a block diagram that illustrates an example of a driver circuit 100 in accordance with the present invention. As described in greater detail below, the driver circuit of the present invention limits the voltage of a wave front launched onto a transmission line to prevent damage from a reflected wave front.

As shown in FIG. 1, driver circuit 100 includes an output driver 110 that is connected to an output node PAD. In the FIG. 1 example, output driver 110 includes a p-channel driver transistor P1 and an n-channel driver transistor N1. Transistor P1 has a source connected to a supply voltage VDD, a drain connected to the output node PAD, and a gate. Transistor N1, in turn, has a source connected to ground, a drain connected to the output node PAD, and a gate.

As further shown in FIG. 1, driver circuit 100 also includes a trip point circuit 112 that has an input connected to the output node PAD, and an output that generates a trip point signal TP. Trip point circuit 112 changes the logic state of the trip point signal TP when the voltage on the output node PAD rises above a trip point voltage, such as 0.5 VDD, and when the voltage on the output node PAD falls below the trip point voltage.

For example, trip point circuit 112 can be implemented with an inverter 112V that has an input connected to the output node PAD, and an output that generates the trip point signal TP. Inverter 112V changes the logic state of the trip point signal TP when the voltage on the output node PAD rises above the trip point voltage, and when the voltage on the output node PAD falls below the trip point voltage.

In addition, driver circuit 100 includes a first control circuit 114 and a second control circuit 116. First control circuit 114 controls transistor P1 in response to a data signal DS and the trip point signal TP by controlling the current sourced to or sunk from the gate of transistor P1. Second control circuit 116, in turn, controls transistor N1 in response to the data signal DS and the trip point signal TP by controlling the current sourced to or sunk from the gate of transistor N1.

In operation, assume that the logic state of the data signal DS input to the first and second control circuits 114 and 116 is low. Further assume that the voltage on the output node PAD is low, i.e., the data signal DS has been low long enough for transistor N1 to pull the output node PAD all the way down to ground, including any effects of the transmission line. When the voltage on the output node PAD is low, the logic state of the trip point signal TP input to the first and second control circuits 114 and 116 indicates that the voltage on the output node PAD is below the trip point voltage.

These inputs have caused first control circuit 114 to source a current to the gate of transistor P1, which pulls up the voltage on the gate of transistor P1 and turns off transistor P1. In addition, these inputs have also caused second control circuit 116 to source a current to the gate of transistor N1, which pulls up the voltage on the gate of transistor N1 and turns on transistor N1. With transistor N1 turned on, transistor N1 pulls the voltage on the output node PAD down to ground.

When the logic state of the data signal DS then changes from a logic low to a logic high, the logic state of the trip point signal TP initially remains unchanged. These inputs cause the first control circuit 114 to sink a current from the gate of transistor P1, which turns on transistor P1. These inputs also cause second control circuit 116 to sink a large current from the gate of transistor N1, which quickly turns off transistor N1 to prevent a shoot through current from flowing through transistors P1 and N1.

When transistor P1 turns on, transistor P1 sources a current into the output node PAD that raises the voltage on the output node PAD. If trip point circuit 112 is formed to have a trip point voltage of 0.5 VDD, then trip point circuit 112 changes the logic state of the trip point signal TP when the voltage on the output node PAD rises above 0.5 VDD to indicate that the voltage on the output node PAD is now greater than the trip point voltage.

The changed logic state of the trip point signal TP causes first control circuit 114 to reduce the magnitude of the current sunk from the gate of transistor P1. As a result, first control circuit 114 continues to pull down the voltage on the gate of transistor P1, but now at a slower rate. This places a known voltage on the gate of transistor P1.

Thus, the voltage on the output node PAD initially rises at a first rate, and then rises at a second slower rate. As a result, the impedance of driver circuit 100 is made to match the impedance of the transmission line for a duration of up to three or more one-way time delays of the transmission line.

Therefore, in accordance with the present invention, the voltage of the initial wave front launched by transistor P1 down the transmission line has a value of approximately 0.5 VDD. When the initial wave front reaches a receiver that appears as an open circuit, 100% of the wave front is reflected back positively to driver circuit 100. As a result, immediately following the reflection, the voltage at the input of the receiver is approximately equal to VDD.

In addition, after a second time delay, the reflected wave front reaches driver circuit 100 with a voltage of approximately VDD. Further, when the voltage on the initial wave front is equal to 0.5 VDD, the impedances of the driver and transmission line are matched. In this case, none of the reflected wave front received by driver circuit 100 is reflected back again to the receiver. Thus, driver circuit 100 provides a full voltage signal at the receiver without generating a reflected wave front that can damage the receiver or the driver.

Assume now that the logic state of the data signal DS input to the first and second control circuits 114 and 116 is high. Further assume that the voltage on the output node PAD is high, i.e., the output signal DS has been high long enough for transistor P1 to pull the output node PAD all the way up to the power supply voltage VDD. When the voltage on the output node PAD is high, the logic state of the trip point signal TP input to the first and second control circuits 114 and 116 indicates that the voltage on the output node PAD is above the trip point voltage.

These inputs have caused second control circuit 116 to sink a current from the gate of transistor N1, which pulls down the voltage on the gate of transistor N1 and turns off transistor N1. In addition, these inputs have also caused first control circuit 114 to sink a current from the gate of transistor P1, which pulls down the voltage on the gate of transistor P1 and turns on transistor P1. With transistor P1 turned on, transistor P1 pulls the voltage on the output node PAD up to the supply voltage VDD.

When the logic state of the data signal DS then changes from a logic high to a logic low, the logic state of the trip point signal TP initially remains unchanged. These inputs cause second control circuit 116 to source a current to the gate of transistor N1, which turns on transistor N1. These inputs also cause first control circuit 114 to source a large current to the gate of transistor P1, which quickly turns off transistor P1 to prevent a shoot through current from flowing through transistors P1 and N1.

When transistor N1 turns on, transistor N1 sinks a current from the output node PAD that pulls down the voltage on the output node PAD. If trip point circuit 112 is formed to have a trip point voltage of 0.5 VDD, then trip point circuit 112 changes the logic state of the trip point signal TP when the voltage on the output node PAD falls below 0.5 VDD to indicate that the voltage on the output node PAD is now less than the trip point voltage.

The changed logic state of the trip point signal TP causes second control circuit 116 to reduce the magnitude of the current sourced to the gate of transistor N1. As a result, second control circuit 116 continues to pull up the voltage on the gate of transistor N1, but now at a slower rate. This places a known voltage on the gate of transistor N1.

Thus, the voltage on the output node PAD initially falls at a first rate, and then falls at a second slower rate. As a result, the impedance of driver circuit 100 is made to match the impedance of the transmission line for a duration of up to three or more one-way time delays of the transmission line.

Therefore, in accordance with the present invention, the voltage of the initial wave front launched by transistor N1 down the transmission line has a value of approximately 0.5 VDD. When the initial wave front reaches the receiver, 100% of the wave front is reflected back to driver circuit 100. As a result, immediately following the reflection, the voltage at the input of the receiver is equal to ground. In addition, after a second time delay, the reflected wave front reaches driver circuit 100 as ground.

Figure 2:
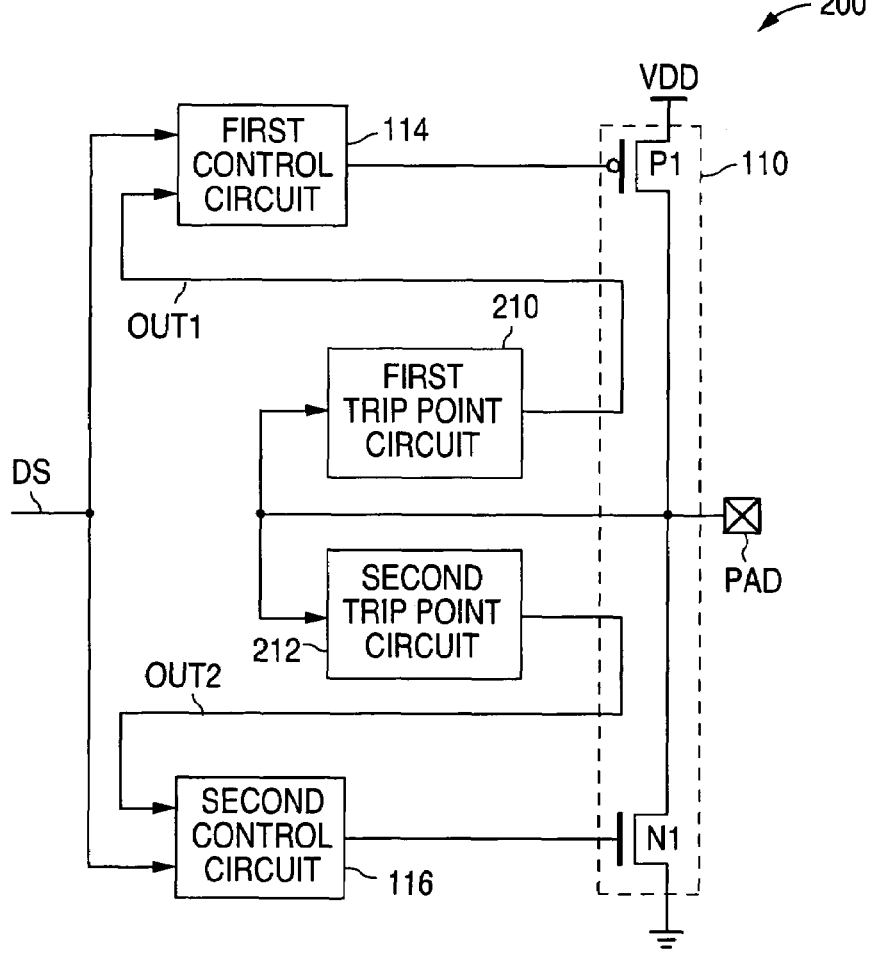
FIG. 2 is a block diagram illustrating an example of a driver circuit 200 in accordance with a first alternate embodiment of the present invention.

FIG. 2 shows a block diagram that illustrates an example of a driver circuit 200 in accordance with a first alternate embodiment of the present invention. Driver circuit 200 is similar to driver circuit 100 and, as a result, utilizes the same reference numerals to designate the structures which are common to both drivers.

As shown in FIG. 2, driver circuit 200 differs from driver circuit 100 in that driver circuit 200 includes a first trip point circuit 210 and a second trip point circuit 212 in lieu of trip point circuit 112. Trip point circuit 210 has an input connected to the output node PAD, and an output connected to first control circuit 114. Trip point circuit 210 generates a trip point signal OUT1 that changes logic states when the voltage on the output node PAD rises above a first trip point voltage (and changes back when the voltage on the output node PAD fall below the first trip point voltage). For example, the first trip point voltage can be equal to approximately 0.4 VDD.

Trip point circuit 212 has an input connected to the output node PAD, and an output connected to the second control circuit 116. Trip point circuit 212 generates a trip point signal OUT2 that changes logic states when the voltage on the output node PAD falls below a second trip point voltage (and changes back when the voltage on the output node PAD rises above the second trip point voltage). For example, the second trip point voltage can be equal to approximately 0.6 VDD.

In operation, a time lag exists between when a rising voltage on the output node PAD passes 0.5 VDD, and when the current sourced into the output node PAD by transistor P1 is reduced. As a result, if trip point circuit 112 responds to 0.5 VDD, then the voltage on the output node PAD may actually have risen to, for example, 0.6 VDD before the current sourced into the output node PAD by transistor P1 is reduced.

Thus, by setting trip point circuit 210 to change logic states in response to a first trip voltage that is less than 0.5 VDD, such as 0.4 VDD, then the voltage on the output node PAD will be closer to 0.5 VDD when the current sourced into the output node PAD by transistor P1 is reduced.

Similarly, a time lag exists between when a falling voltage on the output node PAD passes 0.5 VDD, and when the current sunk from the output node PAD by transistor N1 is reduced. As a result, if trip point circuit 112 responds to 0.5 VDD, then the voltage on the output node PAD may actually have fallen to, for example, 0.4 VDD before the current sunk from the output node PAD by transistor N1 is reduced.

Thus, by setting trip point circuit 212 to change logic states in response to a second trip point voltage that is greater than 0.5 VDD, such as 0.6 VDD, then the voltage on the output node PAD will be closer to 0.5 VDD when the current sunk from the output node PAD by transistor N1 is reduced.

Figure 3:
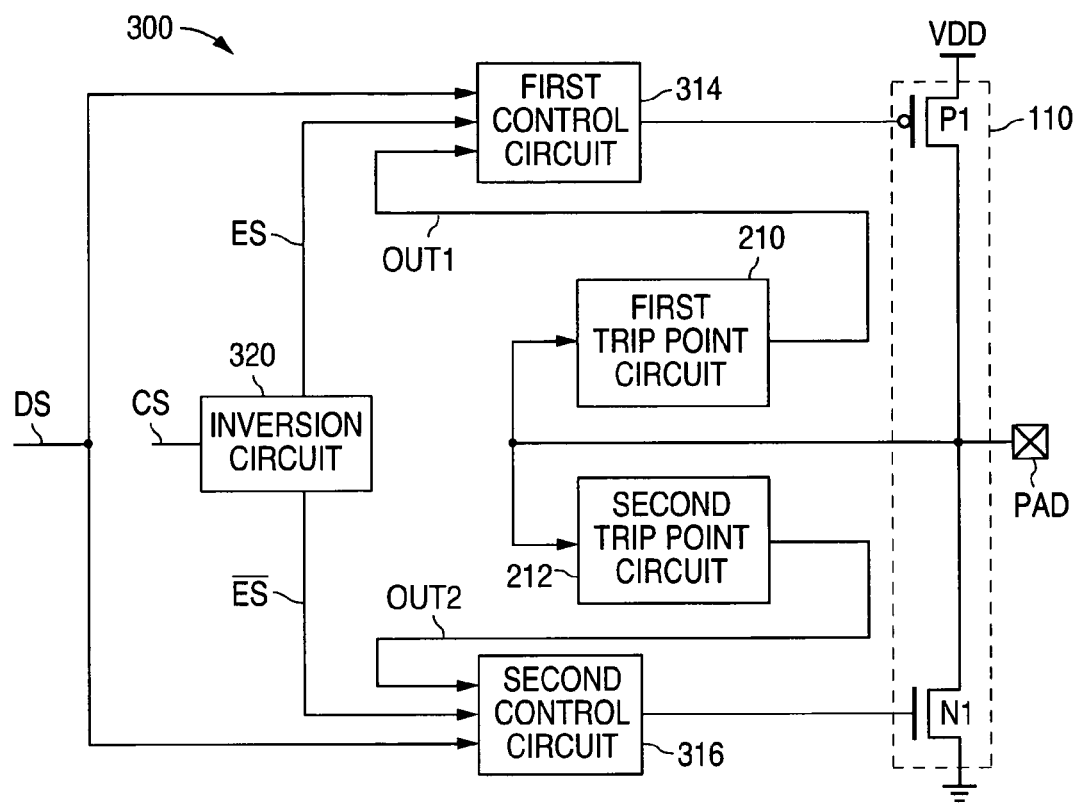
FIG. 3 is a block diagram illustrating an example of a driver circuit 300 in accordance with a second alternate embodiment of the present invention.

FIG. 3 shows a block diagram that illustrates an example of a driver circuit 300 in accordance with a second alternate embodiment of the present invention. Driver circuit 300 is similar to driver circuit 200 and, as a result, utilizes the same reference numerals to designate the structures which are common to both drivers.

As shown in FIG. 3, driver circuit 300 differs from driver circuit 200 in that driver circuit 300 utilizes a first control circuit 314 in lieu of first control circuit 114. First control circuit 314 controls transistor P1 in response to an enable signal ES, the data signal DS, and the trip point signal OUT1 by controlling the current sourced to or sunk from the gate of transistor P1.

In addition, driver circuit 300 differs from driver circuit 200 in that driver circuit 300 utilizes a second control circuit 316 in lieu of second control circuit 116. Second control circuit 316 controls transistor N1 in response to an inverted enable signal ESbar, the data signal DS, and the trip point signal OUT2 by controlling the current sourced to or sunk from the gate of transistor N1.

As shown in FIG. 3, driver circuit 300 can include an inversion circuit 320 that has an input connected to receive an enable control signal CS, a first output that transmits the enable signal ES to first control circuit 314, and a second output that transmits the inverted enable signal ESbar to second control circuit 316. The enable control signal CS and the enable signal ES have the same logic states, while the inverted enable signal ESbar and the enable signal ES have opposite logic states.

In operation, first control circuit 314 operates the same as first control circuit 114, except that when the enable signal ES has a logic low state, first control circuit 314 sources a current to the gate of transistor P1 to turn off transistor P1 regardless of the logic states of the data signal DS and the trip point signal OUT1. On the other hand, when the enable signal ES has a logic high state, first control circuit 314 operates the same as first control circuit 114.

Similarly, second control circuit 316 operates the same as second control circuit 116, except that when the inverted enable signal ESbar has a logic high state, second control circuit 316 sinks a current from the gate of transistor N1 to turn off transistor N1 regardless of the logic states of the data signal DS and the trip point signal OUT2. On the other hand, when the inverted enable signal ESbar has a logic low state, second control circuit 316 operates the same as second control circuit 116.

The advantage of using the enable signal ES and the inverted enable signal ESbar is that both transistors P1 and N1 can be turned off, regardless of the logic states of the data signal DS and the trip point signals OUT1 and OUT2. This, in turn, allows other voltages from other devices to be placed on the output node PAD without effecting driver circuit 300. (Driver circuit 300 can alternately be implemented with trip point circuit 112 of FIG. 1 rather than the trip point circuits 210 and 212 of FIG. 2.)

Figure 4A:
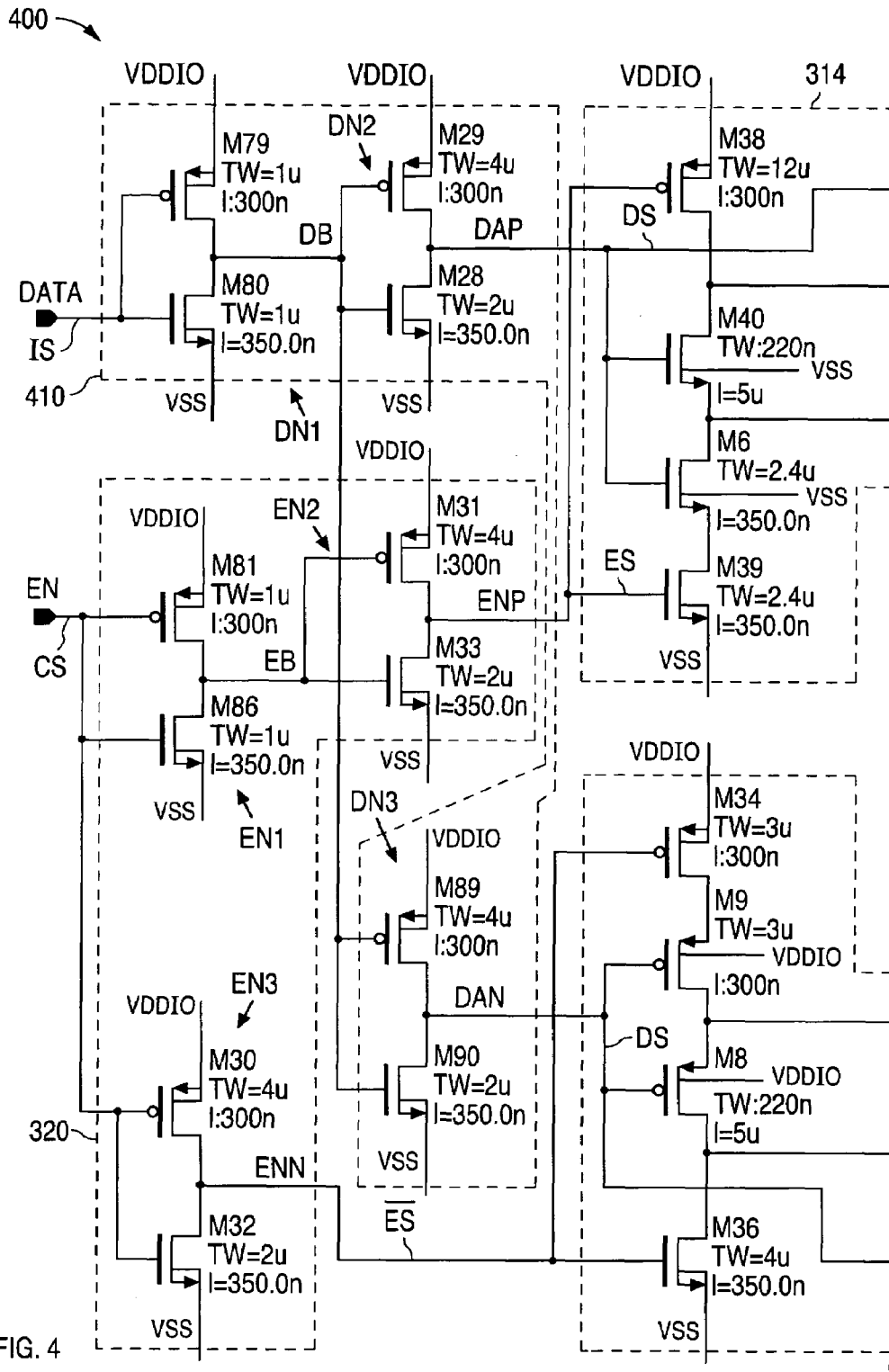
FIGS. 4A and 4B are schematic diagrams illustrating a driver circuit 400 that represents an example of an implementation of driver circuit 300 in accordance with the present invention.
Figure 4B:
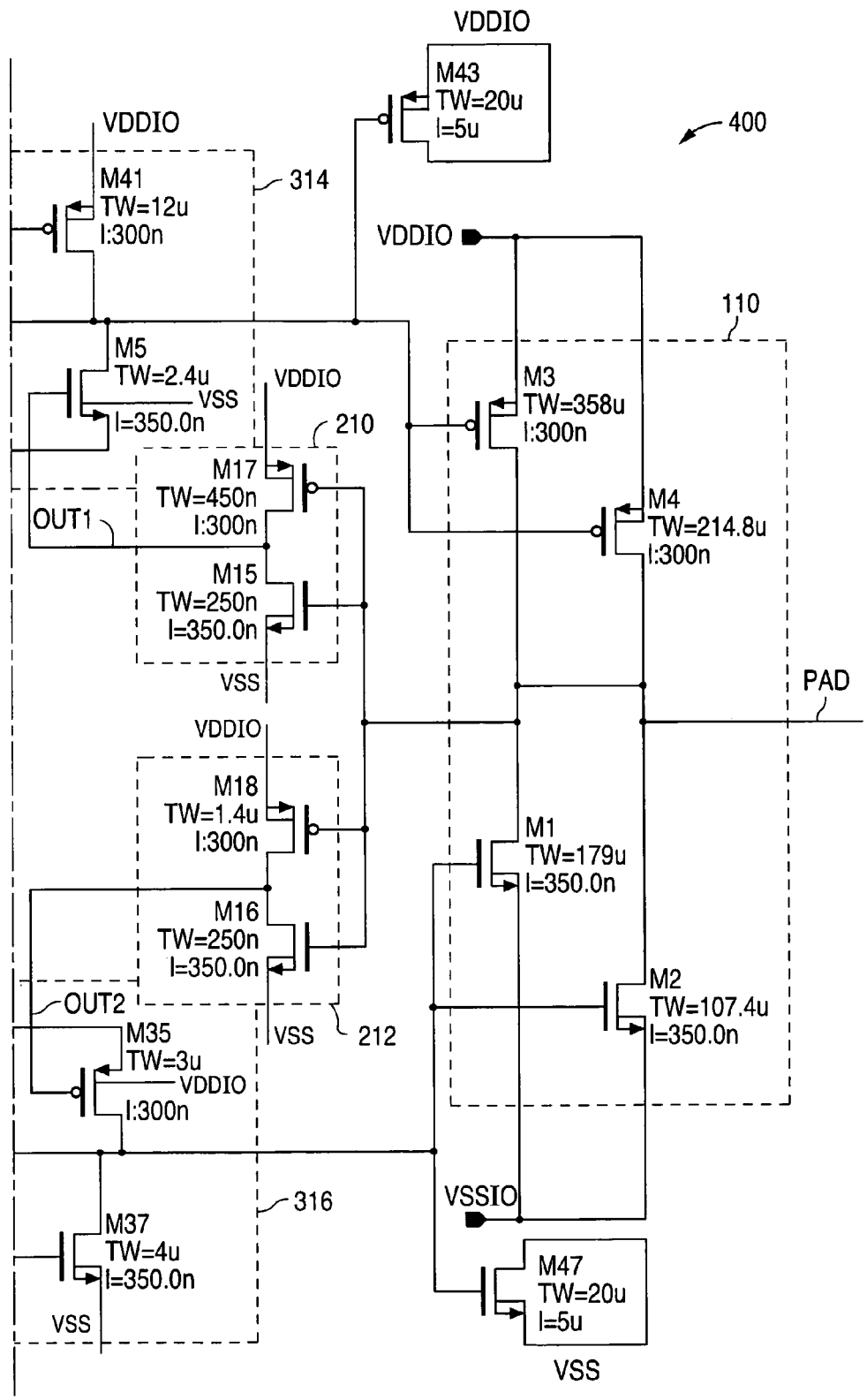

FIGS. 4A and 4B show schematic diagrams that illustrate a driver circuit 400 that represents an example of an implementation of driver circuit 300 in accordance with the present invention. As shown in the FIGS. 4A and 4B example, driver circuit 400 implements output driver 110 with two p-channel output transistors M3 and M4 in lieu of transistor P1, and two n-channel output transistors M1 and M2 in lieu of transistor N1.

The output transistors M3 and M4 both have a source connected to a supply voltage VDDIO, a drain connected to the output node PAD, and a gate. The output transistors M1 and M2 both have a source connected to VSSIO, a drain connected to the output node PAD, and a gate. (Output driver 110 of driver circuit 400 can alternately be formed with a single p-channel transistor and a single n-channel transistor.)

As further shown in the FIGS. 4A and 4B example, driver circuit 400 implements trip point circuit 210 with an inverter that has a p-channel transistor M17 and an n-channel transistor M15. Transistor M17 has a source connected to the supply voltage VDDIO, and a gate connected to the output node PAD. Transistor M15 has a source connected to VSSIO, a drain connected to the drain of transistor M17, and a gate connected to the output node PAD.

Driver circuit 400 implements trip point circuit 212 with an inverter that has a p-channel transistor M18 and an n-channel transistor M16. Transistor M18 has a source connected to the supply voltage VDDIO, and a gate connected to the output node PAD. Transistor M16 has a source connected to VSSIO, a drain connected to the drain of transistor M18, and a gate connected to the output node PAD.

In addition, driver circuit 400 implements first control circuit 314 with transistors M5, M6, M38, M39, M40, and M41, and two p-channel transistors M38 and M41. Transistor M5 has a source, a drain connected to the gates of the output transistors M3 and M4, and a gate connected to the drains of transistors M15 and M17. Transistor M6 has a source, a drain connected to the source of transistor M5, and a gate connected to a data node DAP. Transistor M38 has a source connected to the supply voltage VDDIO, a drain connected to the gates of the output transistors M3 and M4, and a gate connected to an enable node ENP.

Transistor M39 has a source connected to VSS, a drain connected to the source of transistor M6, and a gate connected to the enable node ENP. Transistor M40 has a source connected to the source of transistor M5, a drain connected to the gates of the output transistors M3 and M4, and a gate connected to the data node DAP. Transistor M41 has a source connected to the supply voltage VDDIO, a drain connected to the gates of the output transistors M3 and M4, and a gate connected to the data node DAP.

As shown in FIGS. 4A and 4B, driver circuit 400 implements second control circuit 316 with transistors M8, M9, M34, M35, M36, and M37. Transistor M8 has a source, a drain connected to the gates of the output transistors M1 and M2, and a gate connected to a data node DAN. Transistor M9 has a source, a drain connected to the source of transistor M8, and a gate connected to the data node DAN. Transistor M34 has a source connected to the supply voltage VDDIO, a drain connected to the source of transistor M9, and a gate connected to an enable node ENN.

Transistor M35 has a source connected to the source of transistor M8, a drain connected to the gates of the output transistors M1 and M2, and a gate connected to the drains of transistors M16 and M18. Transistor M36 has a source connected to VSS, a drain connected to the gates of the output transistors M1 and M2, and a gate connected to the enable node ENN. Transistor M37 has a source connected to VSS, a drain connected to the gates of the output transistors M1 and M2, and a gate connected to the data node DAN.

As further shown in the FIGS. 4A and 4B example, driver circuit 400 implements inversion circuit 320 with three inverters EN1, EN2, and EN3 to generate the enable signal ES and the inverted enable signal ESbar. Inverter EN1 has an input connected to an enable node EN, and an output connected to an enable node EB.

Inverter EN2 has an input connected to the enable node EB, and an output connected to the enable node ENP. Inverter EN3 has an input connected to the enable node EN, and an output connected to the enable node ENN. Thus, when the enable signal ES is a logic high, the logic state on the enable node ENP is a logic high, while the logic state on the enable node ENN is a logic low.

As shown in FIGS. 4A and 4B, driver circuit 400 can include a buffer circuit 410 that receives an input signal IS and, in response, generates the data signal DS. In the FIGS. 4A and 4B example, buffer circuit 410 includes three inverters DN1, DN2, and DN3 that buffer the input signal IS to form the data signal DS.

Inverter DN1 has an input connected to a data node DATA, and an output connected to a data node DB. Inverter DN2 has an input connected to the data node DB, and an output connected to the data node DAP. Inverter DN3 has an input connected to the data node DB, and an output connected to the data node DAN. Thus, when the logic state of the input signal IS is low, the logic states on the data nodes DAP and DAN are also logic lows. When the logic state of the input signal IS is high, the logic states on the data nodes DAP and DAN are also logic highs.

To operate, the control signal CS is set to a logic high. Following the inversions of inverters EN1 and EN2, inversion circuit 320 outputs the enable signal ES with a logic high that turns off transistor M38, and turns on transistor M39. In addition, following the inversion of inverter EN3, inversion circuit 320 outputs the inverted enable signal ESbar with a logic low that turns on transistor M34, and turns off transistor M36.

In operation, assume that the logic state of the input signal IS is low, and the voltage on the output node PAD is low. When the logic state of the input signal IS is low, following the inversions of inverters DN1 and DN2, buffer circuit 410 transmits the data signal DS with a logic low to the gate of transistor M41, thereby turning on transistor M41, and to the gates of transistors M6 and M40, thereby turning off transistors M6 and M40.

In addition, when the voltage on the output node PAD is low, the trip point signal OUT1 places a logic high on transistor M5, thereby turning on transistor M5. However, no current flows through transistor M5 because transistor M6 is turned off. As a result, transistor M41 sources a current to the gates of the output transistors M3 and M4 which, in turn, turns off the output transistors M3 and M4.

Further, following the inversions of inverters DN1 and DN3, buffer circuit 410 transmits the data signal DS with a logic low to the gates of transistors M8 and M9, thereby turning on transistors M8 and M9, and to the gate of transistor M37, thereby turning off transistor M37. In addition, since the logic state on the output node PAD is low, the trip point signal OUT2 places a logic high on transistor M35, thereby turning off transistor M35. As a result, transistors M8, M9, and M34 source a current to the gates of the output transistors M1 and M2 which, in turn, turns on the output transistors M1 and M2. With the output transistors M1 and M2 turned on, the output transistors M1 and M2 pull the voltage on the output node PAD down to ground.

When the logic state of the data signal DS then changes from a logic low to a logic high, the logic states of the trip point signals OUT1 and OUT2 initially remain high. Thus, transistor M5 remains turned on, and transistor M35 remains turned off. In addition, following the inversions of inverters DN1 and DN3, buffer circuit 410 transmits the data signal DS with a logic high to the gates of transistors M8 and M9, thereby turning off transistors M8 and M9, and to the gate of transistor M37, thereby turning on transistor M37. As a result, transistor M37 pulls the gates of the output transistors M1 and M2 to ground which, in turn, turns off the output transistors M1 and M2.

At the same time, following the inversions of inverters DN1 and DN2, buffer circuit 410 transmits the data signal DS with a logic high to the gate of transistor M41, thereby turning off transistor M41, and to the gates of transistors M6 and M40, thereby turning on transistors M6 and M40. As a result, transistors M5, M6, M39, and M40 sink a current from the gates of the output transistors M3 and M4 which, in turn, turns on the output transistors M3 and M4.

When the output transistors M3 and M4 turn on, the output transistors M3 and M4 source a current into the output node PAD that raises the voltage on the output node PAD. If trip point circuit 210 is formed to have a trip point voltage of 0.4 VDDIO, then trip point circuit 210 changes the logic state of the trip point signal OUT1 when the voltage on the output node PAD rises above 0.4 VDDIO to indicate that the voltage on the output node PAD is now greater than the first trip point voltage.

The logic low of the trip point signal OUT1 output by trip point circuit 210 turns off transistor M5 which, in turn, reduces the magnitude of the current sunk from the gates of the output transistors M3 and M4. Since transistors M6, M39, and M40 remain turned on, the transistors continue to pull the voltage on the gates of the output transistors M3 and M4 to ground, but at a slower rate. In accordance with the present invention, transistor M5 is formed to be substantially stronger than transistor M40.

Thus, when transistors M5 and M40 are both turned on, transistors M5 and M40 pull the voltage on the gates of the output transistors M3 and M4 down which, in turn, causes the voltage on output node PAD to rise to 0.4 VDDIO. However, when transistor M5 turns off, transistor M40 continues to pull down the voltage, but at a slower rate. This places a known voltage on the gates of the output transistors M3 and M4.

Thus, the voltage on the output node PAD rises at a first rate, and then rises at a second slower rate. As a result, the impedance of driver circuit 400 is made to match the impedance of the transmission line for a duration of up to three or more one-way time delays of the transmission line.

Therefore, in accordance with the present invention, the voltage of the initial wave front launched by the output transistors M3 and M4 down the transmission line has a value of approximately 0.5 VDDIO. When the initial wave front reaches a receiver that appears as an open circuit, 100% of the wave front is reflected back positively to driver circuit 400.

As a result, immediately following the reflection, the voltage at the input of the receiver is equal to approximately VDDIO. In addition, after a second time delay, the reflected wave front reaches driver circuit 400 with a voltage of approximately VDDIO. Further, when the voltage of the initial wave front is equal to 0.5 VDDIO, the impedances of the driver and transmission line are matched. In this case, none of the reflected wave front received by driver circuit 400 is reflected back again to the receiver. Thus, driver circuit 400 provides a full voltage signal to the receiver without generating a reflected wave front that can damage the receiver or the driver.

Assume now that the logic state of the input signal IS is high, and the voltage on the output node PAD is high. When the logic state of the input signal IS is high, following the inversions of inverters DN1 and DN2, buffer circuit 410 transmits the data signal DS with a logic high to the gate of transistor M41, thereby turning off transistor M41, and to the gates of transistors M6 and M40, thereby turning on transistors M6 and M40.

In addition, when the voltage on the output node PAD is high, the trip point signal OUT1 places a logic low on transistor M5, thereby turning off transistor M5. As a result, transistors M6, M39, and M40 sink a current from the gates of the output transistors M3 and M4 which, in turn, turns on the output transistors M3 and M4. With the output transistors M3 and M4 turned on, the output transistors M3 and M4 pull the voltage on the output node PAD up to the supply voltage VDDIO.

Further, following the inversions of inverters DN1 and DN3, buffer circuit 410 transmits the data signal DS with a logic high to the gates of transistors M8 and M9, thereby turning off transistors M8 and M9, and to the gate of transistor M37, thereby turning on transistor M37. In addition, since the logic state on the output node PAD is high, the trip point signal OUT2 places a logic low on transistor M35, thereby turning on transistor M35. However, transistor M35 can not source any current because transistor M9 is turned off. As a result, transistor M37 sinks a current from the gates of the output transistors M1 and M2 which, in turn, turns off the output transistors M1 and M2.

When the logic state of the data signal DS changes from a logic high to a logic low, the logic states of the trip point signals OUT1 and OUT2 initially remain low. Thus, transistor M5 remains turned off, and transistor M35 remains turned on. As a result, following the inversions of inverters DN1 and DN2, buffer circuit 410 transmits the data signal DS with a logic low to the gate of transistor M41, thereby turning on transistor M41, and to the gates of transistors M6 and M40, thereby turning off transistors M6 and M40. As a result, transistor M41 sources a current to the gates of the output transistors M3 and M4 which, in turn, turns off the output transistors M3 and M4.

At the same time, following the inversions of inverters DN1 and DN3, buffer circuit 410 transmits the data signal DS with a logic low to the gates of transistors M8 and M9, thereby turning on transistors M8 and M9, and to the gate of transistor M37, thereby turning off transistor M37. As a result, transistors M8, M9, M34, and M35 source a current to the gates of the output transistors M1 and M2 which, in turn, turns on the output transistors M1 and M2.

When the output transistors M1 and M2 turn on, the output transistors M1 and M2 sink a current from the output node PAD that lowers the voltage on the output node PAD. If trip point circuit 212 is formed to have a trip point voltage of 0.6 VDDIO, then trip point circuit 212 changes the logic state of the trip point signal OUT2 when the voltage on the output node PAD rises above 0.6 VDDIO to indicate that the voltage on the output node PAD is now less than the second trip point voltage.

The logic high of the trip point signal OUT2 output by trip point circuit 212 turns off transistor M35. Since transistors M8, M9, and M34 remain turned on, the transistors continue to raise the voltage on the gates of the output transistors M3 and M4, but at a lower rate. In accordance with the present invention, transistor M35 is formed to be substantially stronger than transistor M8.

Thus, when transistors M35 and M8 are both turned on, transistors M35 and M8 raise the voltage on the gates of the output transistors M1 and M2 which, in turn, causes the voltage on output node PAD to fall to 0.6 VDDIO. However, when transistor M35 turns off, transistor M8 continues to pull up the voltage, but at a slower rate. This places a known voltage on the gates of the output transistors M1 and M2.

As a result, the voltage on the output node PAD falls at a first rate, and then falls at a second slower rate. As a result, the impedance of driver circuit 400 is made to match the impedance of the transmission line for a duration of up to three or more one-way time delays of the transmission line.

Therefore, in accordance with the present invention, the voltage of the initial wave front launched by the output transistors M1 and M2 down the transmission line has a value of approximately 0.5 VDDIO. When the initial wave front reaches the receiver, 100% of the wave front is reflected back to driver circuit 400.

As a result, immediately following the reflection, the voltage at the input of the receiver is equal to ground. In addition, after a second time delay, the reflected wave front reaches driver circuit 400 as ground. (Driver circuit 400 can alternately be implemented with trip point circuit 112 of FIG. 1 rather than trip point circuits 210 and 212 of FIG. 2, without inversion circuit 320, and without buffer circuit 410.)

In addition, as shown in FIGS. 4A and 4B, driver circuit 400 can optionally include transistors M43 and M47. Transistor M43 has a source, drain, and body connected to the supply voltage VDDIO, and a gate connected to the gates of the output transistors M3 and M4. Transistor M47 has a source, drain, and body connected to VSS, and a gate connected to the gates of the output transistors M1 and M2.

In operation, transistor M43 adds gate-to-source capacitance to the inherent gate-to-source capacitance of the output transistors M3 and M4. Similarly, transistor M47 adds gate-to-source capacitance to the inherent gate-to-source capacitance of the output transistors M1 and M2. The added gate-to-source capacitance, in turn, holds the gate-to-source voltages of the output transistors at a more stable value.

The MOS capacitor values vary with the gate-to-source voltages. The MOS capacitor values drop to Cmin=0.3*Cox when the gate-to-source voltages equal the threshold voltage, and elsewhere increase to Cox. When, for example, transistors M5 and M40 turn on the output transistors M3 and M4, the gate-to-source capacitance is low. In this case, the added gate-to-source capacitance is not needed to stabilize the gate-to-source voltages of the output transistors M3 and M4. However, when transistor M5 turns off so that only transistor M40 is turned on, the gate-to-source capacitance is high so that the capacitance holds the gate-to-source voltages of the output transistors M3 and M4 at a more stable value.

Figure 5A:
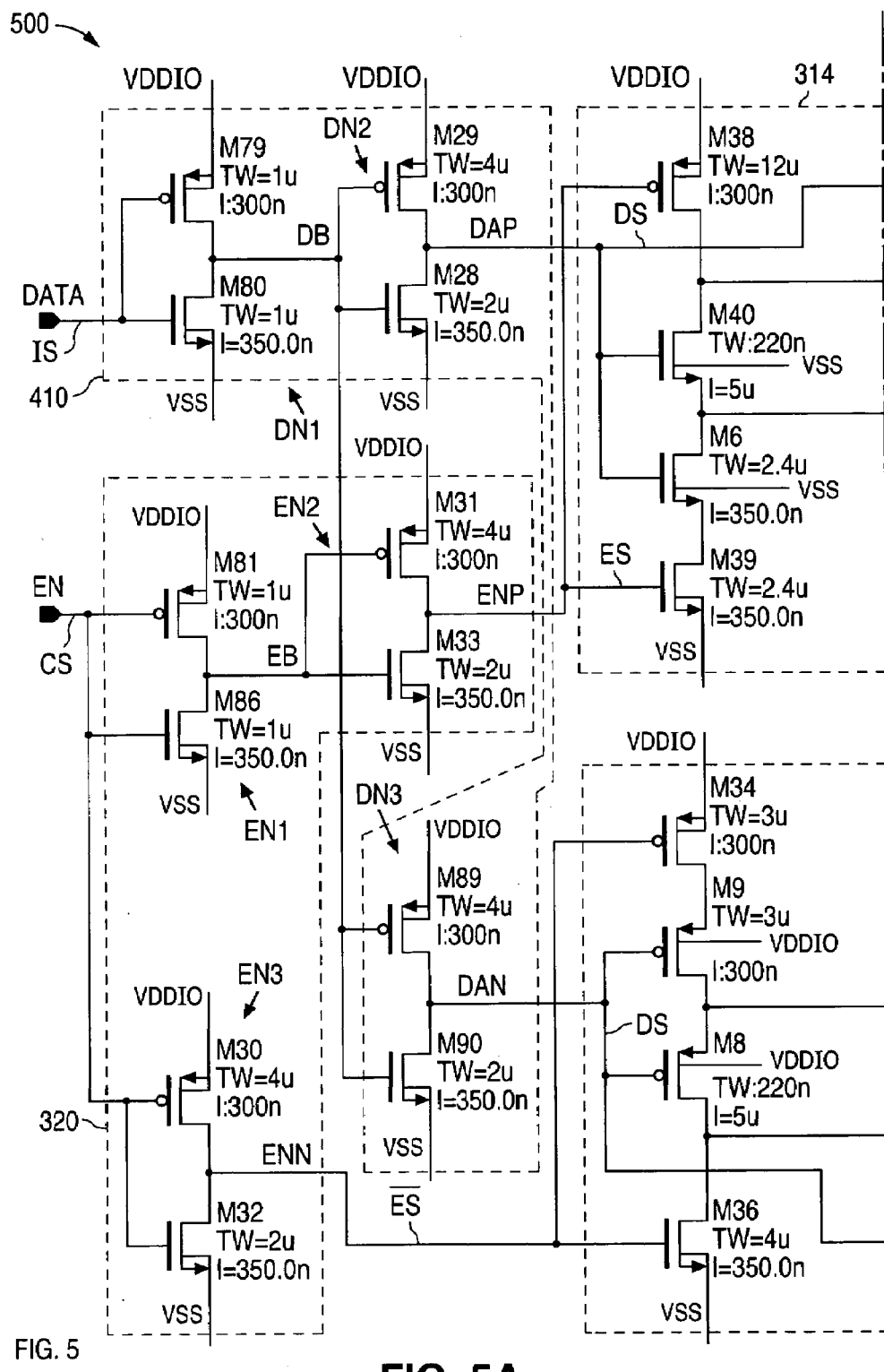
FIGS. 5A and 5B are schematic diagrams illustrating a driver circuit 500 that represents an example of an alternate embodiment of driver circuit 400 in accordance with the present invention.
Figure 5B:
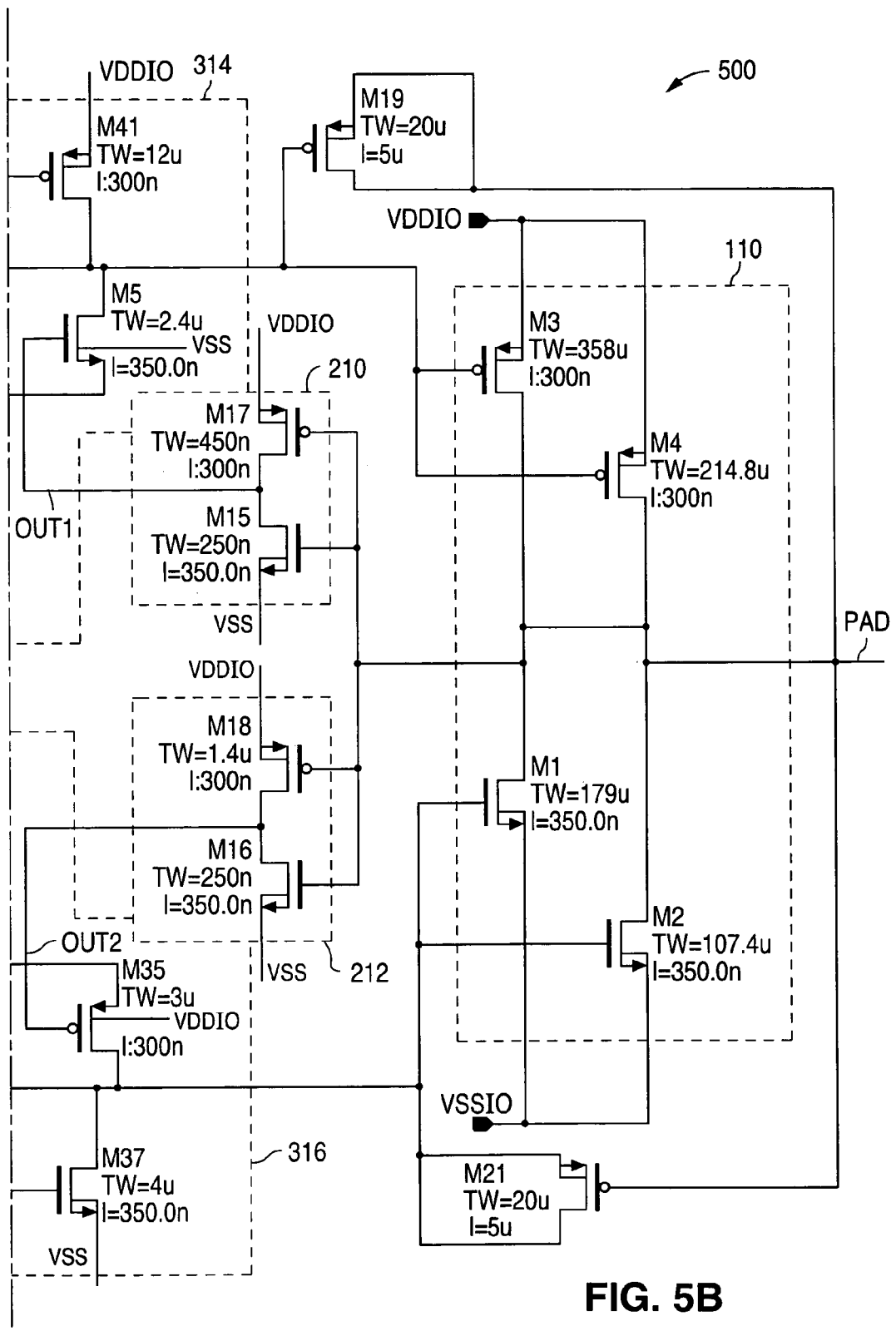

FIGS. 5A and 5B show schematic diagrams that illustrate a driver circuit 500 that represents an example of an alternate embodiment of driver circuit 400 in accordance with the present invention. Driver circuit 500 is similar to driver circuit 400 and, as a result, utilizes the same reference numerals to designate the structures which are common to both drivers.

As shown in FIGS. 5A and 5B, driver circuit 500 differs from driver circuit 400 in that driver circuit 500 includes p-channel transistor M19 and p-channel transistor M21 in lieu of transistors M43 and M47. Transistor M19 has a source, drain, and body connected to the output node PAD, and a gate connected to the gates of the output transistors M3 and M4. Transistor M21 has a source, drain, and body connected to the gates of the output transistors M1 and M2, and a gate connected to the output node PAD.

When there can be a lot of variation in the capacitive loading on a transmission line, this variation can effect the rise and fall times of the voltage on the output node PAD. If there is not much loading on the output node PAD, then the output transistors can swing the voltage on the output node PAD at a very fast rate. On the other hand, if there is a lot of loading on the output node PAD, then the output transistors can only swing the voltage on the output node PAD at a much slower rate.

Transistor M19 increases the capacitance between the drains and gates of the output transistors M3 and M4. The output transistors M3 and M4 inherently have a (Miller) capacitance between the drains and the gates of the output transistors M3 and M4. This capacitance provides negative feedback because the output transistors M3 and M4 are inverted between the signal that is coming in on the gates and the signal that is going out on the drains.

Similarly, transistor M21 increases the capacitance between the drains and gates of the output transistors M1 and M2. The output transistors M1 and M2 also inherently have a (Miller) capacitance between the drains and the gates of the output transistors M1 and M2. This capacitance provides negative feedback because the output transistors M1 and M2 are inverted between the signal that is coming in on the gates and the signal that is going out on the drains.

Increasing the capacitance with transistors M19 and M21 increases the negative feedback, which is stronger when the voltage on the output node PAD tries to swing quickly, and weaker when the voltage on the output node PAD swings more slowly. Thus, transistors M19 and M21 slow down the rise and fall times when the capacitive loading is light. As a result, transistors M19 and M21 reduce the rise and fall time variations due to variations in capacitive loading which, in turn, provides a more constant slew rate.

In the present example, the reflected wave front from the transmission line goes through transistors M19 and M21, thereby changing the gate-to-source voltage and output impedance of the output transistors M1/M2 and M3/M4. In the present example, gate-to-drain capacitance can be added to achieve no more than a 2x improvement in slew rate variation.

This provides the Cox maximum gate-to-drain capacitance during the first half of the voltage transition on the output node PAD, and a lower gate-to-drain capacitance during the last half of the voltage transition on the output node PAD where the current strength is reduced.

Maximum capacitance is when the gate is positive and body accumulation occurs. Minimum capacitance is when the gate is a negative value equal to the PMOS threshold voltage (a gate-to-source voltage of about −0.6 v) due to a depletion layer being formed in the PMOS body. This depletion layer is an increase to the MOS capacitor total dielectric thickness.

Figure 6A:
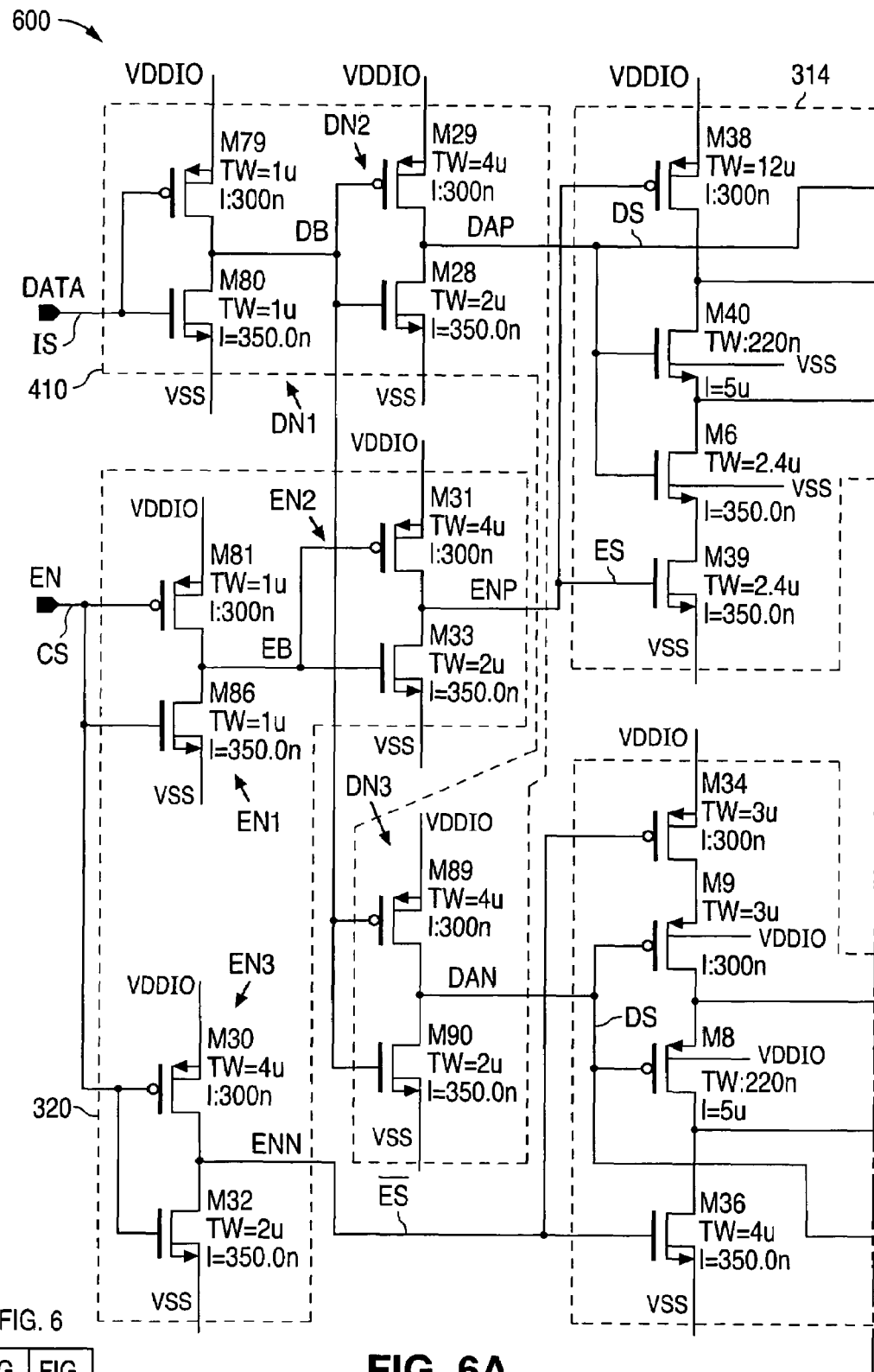
FIGS. 6A and 6B are schematic diagrams illustrating a driver circuit 600 that represents an example of an alternate embodiment of driver circuit 400 in accordance with the present invention.
Figure 6B:
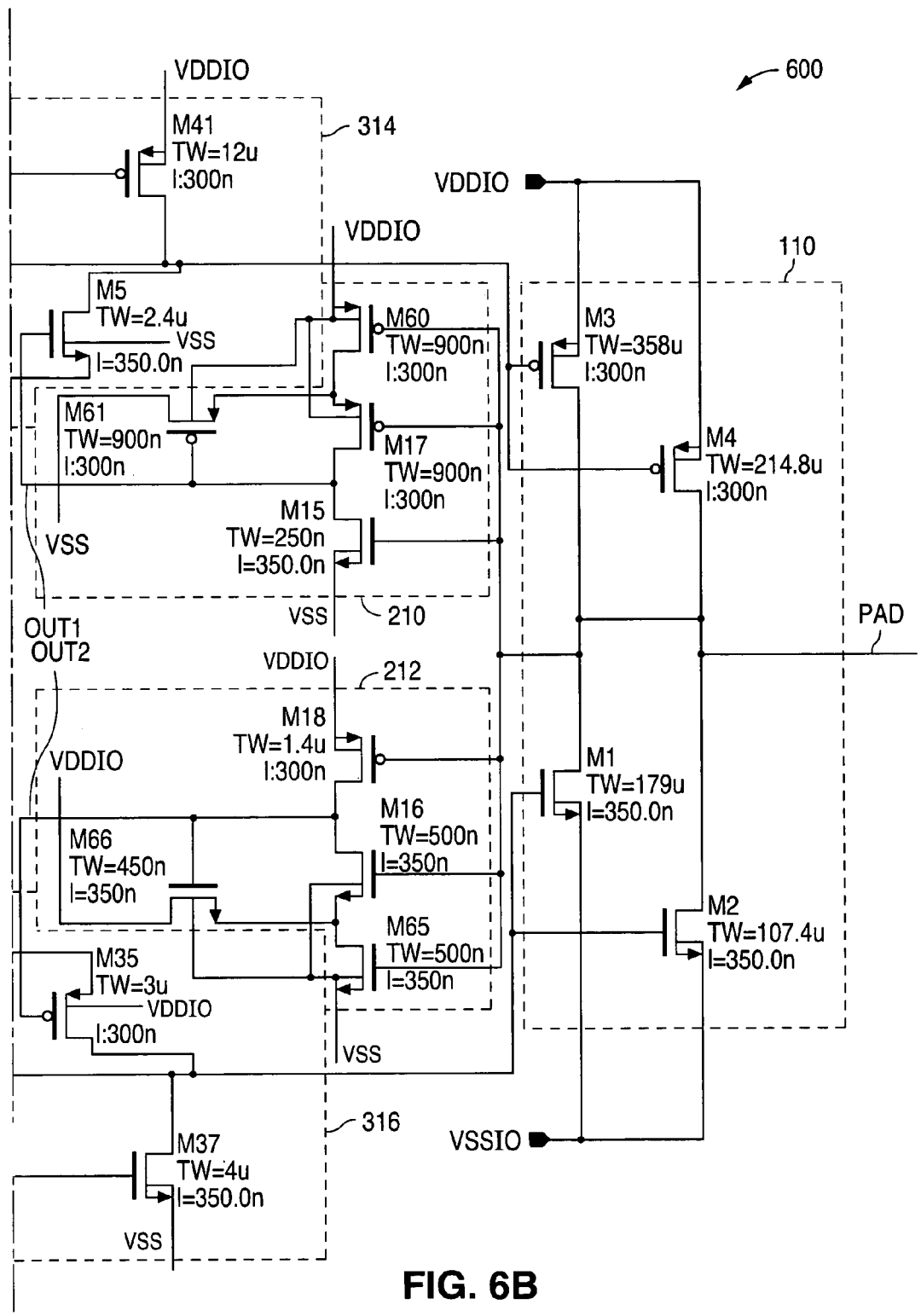

FIGS. 6A and 6B show schematic diagrams that illustrate a driver circuit 600 that represents an example of an alternate embodiment of driver circuit 400 in accordance with the present invention. Driver circuit 600 is similar to driver circuit 400 and, as a result, utilizes the same reference numerals to designate the structures which are common to both drivers.

As shown in FIGS. 6A and 6B, driver circuit 600 differs from driver circuit 400 in that driver circuit 600 adds hysteresis by including p-channel transistors M60 and M61, and n-channel transistors M65 and M66. Transistor M60 has a source connected to the supply voltage VDDIO, a drain connected to the source of transistor M17, and a gate connected to the output node PAD. Transistor M61 has a source connected to the source of transistor M17, a drain connected to VSS, and a gate connected to the drains of transistors M15 and M17.

Transistor M65 has a source connected to VSS, a drain connected to the source of transistor M16, and a gate connected to the output node PAD. Transistor M66 has a source connected to the source of transistor M16, a drain connected to the supply voltage VDDIO, and a gate connected to the drains of transistors M16 and M18.

In operation, driver circuit 600 operates the same as driver circuit 400 when the output node PAD is connected to an open circuit via the transmission line. However, driver circuit 600 operates differently when the output node PAD is connected to a capacitive load, which initially appears to be a shorted load.

Assume that driver circuit 400 is connected to a true shorted load, and the voltage of the initial wave front launched by the output transistors M3 and M4 down the transmission line has a value of approximately 0.5 VDDIO. When the initial wave front reaches the shorted load, 100% of the wave front is reflected back negatively to driver circuit 400. As a result, immediately following the reflection, the voltage at the shorted load is equal to ground. In addition, after a second time delay, the reflected wave front reaches driver circuit 400 with a voltage equal to ground.

On the other hand, assume that driver circuit 400 is connected to a capacitive load. Unlike a true shorted load, a capacitive load only appears to be a shorted load for a brief period of time required to charge up the load. If the capacitance is relatively large, such as 25 pF, then the capacitive load can absorb a significant amount of the initial wave front. If the capacitance is relatively small, such as 5 pF, then very little of the initial wave front is absorbed (e.g., a small capacitive load may result in a reflected wave front of 0.98 VDDIO versus VDDIO).

When the capacitive load is relatively large, the reflected wave front that reaches driver circuit 400 may have, for example, a voltage of 0.2 VDDIO. A voltage of 0.2 VDDIO causes the trip point signal OUT1 to again change states which, in turn, causes transistor M5 to again turn on. When transistor M5 turns on, the output transistors M3 and M4 launch a second wave front down the transmission line with a value of approximately 0.5 VDDIO.

Once charged, the charged capacitive load appears as an open circuit. As a result, the second wave front of 0.5 VDDIO, the 100% reflection, and the existing voltage on the now charged capacitive load causes more than VDDIO to be seen by the capacitive load, thereby overdriving the capacitive load.

Driver circuit 600, however, reduces this effect. When the voltage on the output node PAD is ground, transistor M61 is turned off and driver 600 operates in a manner similar to driver circuit 400, launching an initial wave front down the transmission line with a value of approximately 0.5 VDDIO.

However, as the voltage on the output of trip point circuit 210 falls, transistor M61 turns on which, in turn, limits the magnitude of the current that can be sourced into the output of trip point circuit 210. If a reflected wave front is received from a capacitive load that has a value of, for example, 0.2 VDDIO, then the logic state of the trip point signal OUT1 output from trip point circuit 210 changes states which, in turn, again causes transistor M5 to turn on.

When transistor M5 turns on, the output transistors M3 and M4 source more current into the output node PAD, thereby raising the voltage on the output node PAD. However, because transistor M61 is turned on, transistor M15 is able to sink more current from the output of trip point circuit 210 than can be supplied by transistor M17. This, in turn, effectively reduces the trip point voltage of trip point circuit 210 to, for example, 0.3 VDDIO.

Thus, transistors M60 and M61 have the effect of reducing the trip point voltage of trip point circuit 210 from 0.4 VDDIO to, for example, 0.3 VDDIO when trip point circuit 210 changes the logic state of the trip point signal OUT1 again in response to a reflected wave front from a capacitive load. Reducing the trip point voltage, in turn, reduces the magnitude of the second wave front that is launched down the transmission line which, in turn, reduces the overdrive.

Transistors M65 and M66 operate in a similar manner, and have the effect of increasing the trip point voltage of trip point circuit 212 from 0.6 VDDIO to, for example, 0.7 VDDIO when trip point circuit 212 changes the logic state of the trip point signal OUT2 again in response to a reflected wave front from a capacitive load. Thus, driver circuit 600 limits the effect of a reflected wave front when the initial wave front is launched down a transmission line that is connected to a large capacitive load. (Driver circuit 600 can also be implemented with the negative feedback transistors M19 and M21 illustrated in FIGS. 5A and 5B.)

Figure 7:
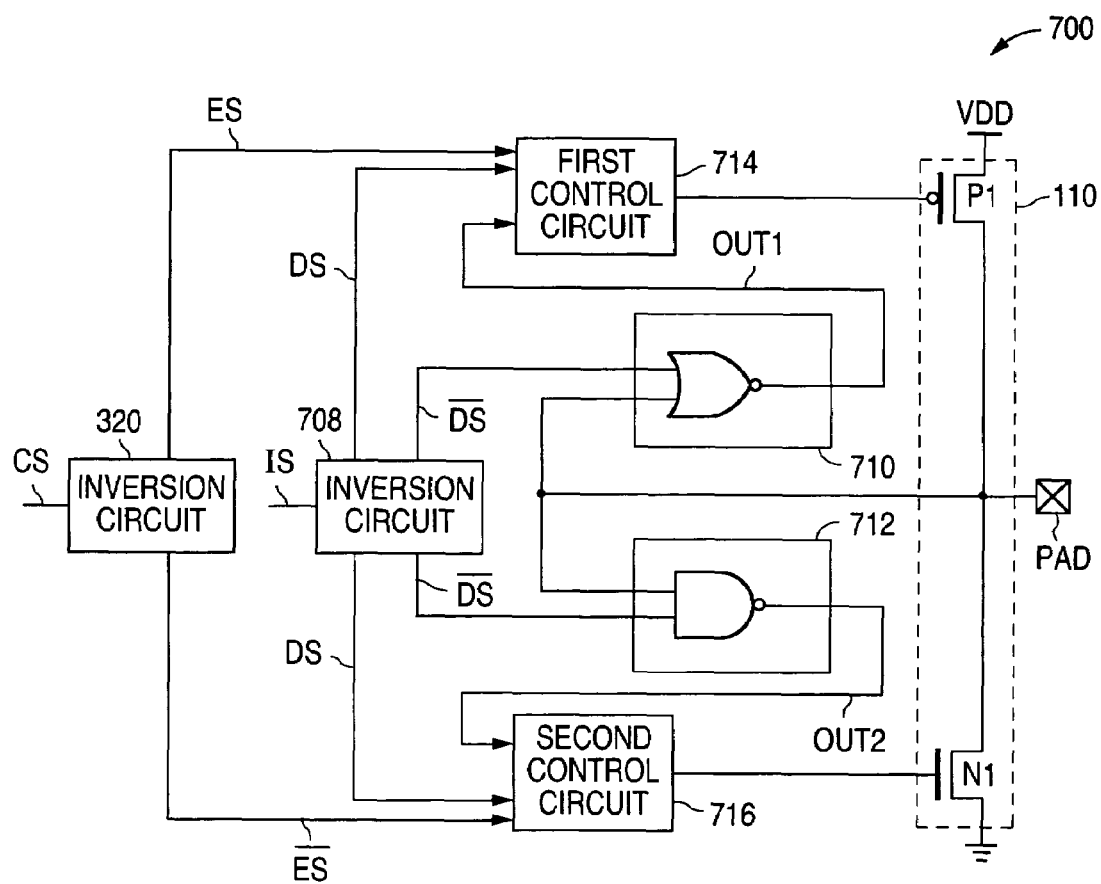
FIG. 7 is a block diagram illustrating an example of a driver circuit 700 in accordance with a third alternate embodiment of the present invention.

FIG. 7 shows a block diagram that illustrates an example of a driver circuit 700 in accordance with a third alternate embodiment of the present invention. Driver circuit 700 is similar to driver circuit 300 and, as a result, utilizes the same reference numerals to designate the structures which are common to both drivers.

As shown in FIG. 7, driver circuit 700 differs from driver circuit 300 in that driver circuit 700 includes an inversion circuit 708 that receives an input signal IS, and outputs the data signal DS with the same logic state as the input signal IS, and an inverted data signal DSbar with a logic state that is the opposite of the logic state of the input signal IS.

As further shown in FIG. 7, driver circuit 700 differs from driver circuit 300 in that driver circuit 700 utilizes a trip point circuit 710 in lieu of trip point circuit 210, and a trip point circuit 712 in lieu of trip point circuit 212. Trip point circuits 710 and 712 have the same inputs and outputs as trip point circuits 210 and 212 except that trip point circuits 710 and 712 also receive the inverted data signal DSbar.

In operation, assume that the logic state of the input signal IS is low, and the voltage on the output node PAD is low. When the logic state of the input signal IS is low, inversion circuit 708 transmits the data signal DS with a logic low to the input of first control circuit 714, and the inverted data signal DSbar with a logic high to trip point circuit 710. Inversion circuit 708 also transmits the data signal DS with a logic low to the input of second control circuit 716, and the inverted data signal DSbar with a logic high to trip point circuit 712.

In addition, the first control circuit 714 receives the trip point signal OUT1 as a logic low, and the second control circuit 716 receives the trip point signal OUT2 as a logic high. Further, first control circuit 714 receives the enable signal as a logic high, while second control circuit 716 receives the inverted enable signal ESbar as a logic low.

These inputs have caused first control circuit 714 to source a current to the gate of transistor P1, which pulls up the voltage on the gate of transistor P1 and turns off transistor P1. In addition, these inputs have also caused the second control circuit 716 to source a current to the gate of transistor N1, which pulls up the voltage on the gate of transistor N1 and turns on transistor N1. With transistor N1 turned on, transistor N1 pulls the voltage on the output node PAD down to ground.

When the logic state of the input signal IS then changes from a logic low to a logic high, the logic state of the data signal DS changes from a logic low to a logic high, and the logic state of the inverted data signal DSbar changes from a logic high to a logic low. In addition, the logic low on the output node PAD and the logic low of the inverted data signal DSbar cause trip point circuit 710 to change the logic state of the trip point signal OUT1 from a logic low to a logic high, while trip point circuit 712 continues to output the logic state of the trip point signal OUT2 as a logic high.

These inputs cause first control circuit 714 to sink a current from the gate of transistor P1, which turns on transistor P1. These inputs also cause second control circuit 716 to sink a large current from the gate of transistor N1, which quickly turns off transistor N1 to prevent a shoot through current from flowing through transistors P1 and N1.

When transistor P1 turns on, transistor P1 sources a current into the output node PAD that raises the voltage on the output node PAD. If trip point circuit 710 is formed to have a trip point voltage of 0.4 VDD, then trip point circuit 710 changes the logic state of the trip point signal OUT1 from a logic high to a logic low when the voltage on the output node PAD rises above 0.4 VDD to indicate that the voltage on the output node PAD is now greater than the first trip point voltage.

The logic low of the trip point signal OUT1 causes first control circuit 714 to reduce the magnitude of the current sunk from the gate of transistor P1. As a result, first control circuit 714 continues to pull down the voltage on the gate of transistor P1, but at a slower rate. This places a known voltage on the gate of transistor P1.

Thus, the voltage on the output node PAD rises at a first rate, and then rises at a second slower rate. As a result, the impedance of driver circuit 700 is made to match the impedance of the transmission line for a duration of up to three or more one-way time delays of the transmission line.

As a result, trip point circuit 710 functions as a NOR gate that inputs the logic states of the output node PAD and the inverted data signal DSbar, and outputs the trip point signal OUT1 with a logic state defined by the NOR function. In addition, first control circuit 714 functions as a modified NAND gate that inputs the logic states of the enable signal ES and the data signal DS, and outputs a voltage to the gate of output transistor P1 that is defined by the modified NAND circuitry. Modified NAND gate 714 also inputs the logic state of the trip point signal OUT1, not as a logic input, but as an input that varies the strength of the pull down.

Assume that the voltage on the output node PAD is low, the data signal DS is low, the inverted data signal DSbar is high, and the enable signal ES is high. When the output node PAD is low and the inverted data signal DSbar is high, NOR gate 710 outputs the trip point signal OUT1 as a logic low. When the data signal is low and the enable signal ES is high, modified NAND gate 714 outputs a high voltage that turns off the output transistor P1.

When the data signal DS changes to a logic high and the inverted data signal changes to a logic low, the low on the output node PAD and the low of the inverted data signal DSbar cause NOR gate 710 to output the trip point signal OUT1 as a logic high. When the data signal DS is high and the enable signal ES is high, modified NAND gate 714 sinks a modified NAND output pull down current from the gate of output transistor P1 that places a logic low on the gate of output transistor P1 and turns on output transistor P1.

When the voltage on the output node PAD rises above the trip point voltage, the logic state of the output node PAD changes from low to high. In response, NOR gate 710 changes the logic state of the trip point signal OUT1 from a logic high to a logic low. Changing the logic state of the trip point signal OUT1 to a logic low does not change the logical output of modified NAND gate 714, but the change does lower the magnitude of the modified NAND output pull down current. The lowered magnitude of the modified NAND output pull down current changes the rate that the voltage on the gate of the output transistor P1 is pulled down which, in turn, changes the rate that the voltage on the output node PAD is pulled up.

Therefore, in accordance with the present invention, the voltage of the initial wave front launched by transistor P1 down the transmission line has a value of approximately 0.5 VDD. When the initial wave front reaches a receiver that appears as an open circuit, 100% of the wave front is reflected back positively to driver circuit 700. As a result, immediately following the reflection, the voltage at the input of the receiver is approximately equal to VDD.

In addition, after a second time delay, the reflected wave front reaches driver circuit 700 with a voltage of approximately VDD. Further, when the voltage on the initial wave front is equal to 0.5 VDD, the impedances of the driver and transmission line are matched. In this case, none of the reflected wave front received by driver circuit 700 is reflected back again to the receiver. Thus, driver circuit 700 provides a full rail voltage signal at the receiver without generating a reflected wave front that can damage the receiver or the driver.

Assume that the logic state of the input signal IS is high, and the voltage on the output node PAD is high. When the logic state of the input signal IS is high, inversion circuit 708 transmits the data signal DS with a logic high to the input of first control circuit 714, and the inverted data signal DSbar with a logic low to trip point circuit 710. Inversion circuit 708 also transmits the data signal DS with a logic high to the input of second control circuit 716, and the inverted data signal DSbar with a logic low to trip point circuit 712.

In addition, the first control circuit 714 receives the trip point signal OUT1 as a logic low, and the second control circuit 716 receives the trip point signal OUT2 as a logic high. Further, first control circuit 714 receives the enable signal as a logic high, while second control circuit 716 receives the inverted enable signal ESbar as a logic low.

These inputs have caused second control circuit 716 to sink a current from the gate of transistor N1, which pulls down the voltage on the gate of transistor N1 to ground and turns off transistor N1. In addition, these inputs have also caused first control circuit 714 to sink a current from the gate of transistor P1, which pulls down the voltage on the gate of transistor P1 and turns on transistor P1. With transistor P1 turned on, transistor P1 pulls the voltage on the output node PAD up to the supply voltage VDD.

When the logic state of the input signal IS then changes from a logic high to a logic low, the logic state of the data signal DS changes from a logic high to a logic low, and the logic state of the inverted data signal DSbar changes from a logic low to a logic high. In addition, the logic high on the output node PAD and the logic high of the inverted data signal DSbar cause trip point circuit 712 to change the logic state of the trip point signal OUT2 from a logic high to a logic low, while trip point circuit 710 continues to output the logic state of the trip point signal OUT1 as a logic low.

These inputs cause the second control circuit 716 to source a current to the gate of transistor N1, which turns on transistor N1. These inputs also cause first control circuit 714 to source a large current to the gate of transistor P1, which quickly turns off transistor P1 to prevent a shoot through current from flowing through transistors P1 and N1.

When transistor N1 turns on, transistor N1 sinks a current from the output node PAD that pulls down the voltage on the output node PAD. If trip point circuit 712 is formed to have a trip point voltage of 0.6 VDD, then trip point circuit 712 changes the logic state of the trip point signal OUT2 from a logic low to a logic high when the voltage on the output node PAD falls below 0.6 VDD to indicate that the voltage on the output node PAD is now less than the second trip point voltage.

The logic high of the trip point signal OUT2 causes second control circuit 716 to reduce the magnitude of the current sourced into the gate of transistor N1. As a result, second control circuit 716 continues to pull up the voltage on the gate of transistor N1, but at a slower rate. This places a known voltage on the gate of transistor N1.

Thus, the voltage on the output node PAD falls at a first rate, and then falls at a second slower rate. As a result, the impedance of driver circuit 700 is made to match the impedance of the transmission line for a duration of up to three or more one-way time delays of the transmission line.

As a result, trip point circuit 712 functions as a NAND gate that inputs the logic states of the output node PAD and the inverted data signal DSbar, and outputs the trip point signal OUT2 with a logic state defined by the NAND function. In addition, second control circuit 716 functions as a modified NOR gate that inputs the logic states of the inverted enable signal ESbar and the data signal DS, and outputs a voltage to the gate of the output transistor N1 that is defined by the modified NOR circuitry. Modified NOR gate 716 also inputs the logic state of the trip point signal OUT2, not as a logic input, but as an input that varies the strength of the pull up.

Assume that the voltage on the output node PAD is high, the data signal DS is high, the inverted data signal DSbar is low, and the inverted enable signal ESbar is low. When the output node PAD is high and the inverted data signal DSbar is low, NAND gate 712 outputs the trip point signal OUT2 as a logic high. When the data signal DS is high and the inverted enable signal ESbar is low, modified NOR gate 716 outputs a low voltage that turns off output transistor N1.

When the data signal DS changes to a logic low and the inverted data signal DSbar changes to a logic high, the high on the output node PAD and the high of the inverted data signal DSbar cause NAND gate 712 to output the trip point signal OUT2 as a logic low. When the data signal DS is low and the inverted enable signal ESbar is low, modified NOR gate 716 sources a modified NOR output pull up current to the gate of output transistor N1 that places a logic high on the gate of output transistor N1 and turns on output transistor N1.

When the voltage on the output node PAD falls below the trip point voltage, the logic state of the output node PAD changes from a logic high to a logic low. In response, NAND gate 712 changes the logic state of the trip point signal OUT2 from a logic low to a logic high. Changing the logic state of the trip point signal OUT2 to a logic high does not change the logical output of modified NOR gate 716, but the change does lower the magnitude of the modified NOR output pull up current. The lowered magnitude of the modified NOR output pull up current changes the rate that the voltage on the gate of the output transistor N1 is pulled up which, in turn, changes the rate that the voltage on the output node PAD is pulled down.

Therefore, in accordance with the present invention, the voltage of the initial wave front launched by transistor N1 down the transmission line has a value of approximately 0.5 VDD. When the initial wave front reaches the receiver, 100% of the wave front is reflected back to driver circuit 700. As a result, immediately following the reflection, the voltage at the input of the receiver is equal to ground. In addition, after a second time delay, the reflected wave front reaches driver circuit 700 as ground. (Driver circuit 700 can alternately be implemented with trip point circuit 112 of FIG. 1 rather than trip point circuits 210 and 212 of FIG. 2, and without inversion circuit 320.)

Figure 8A:
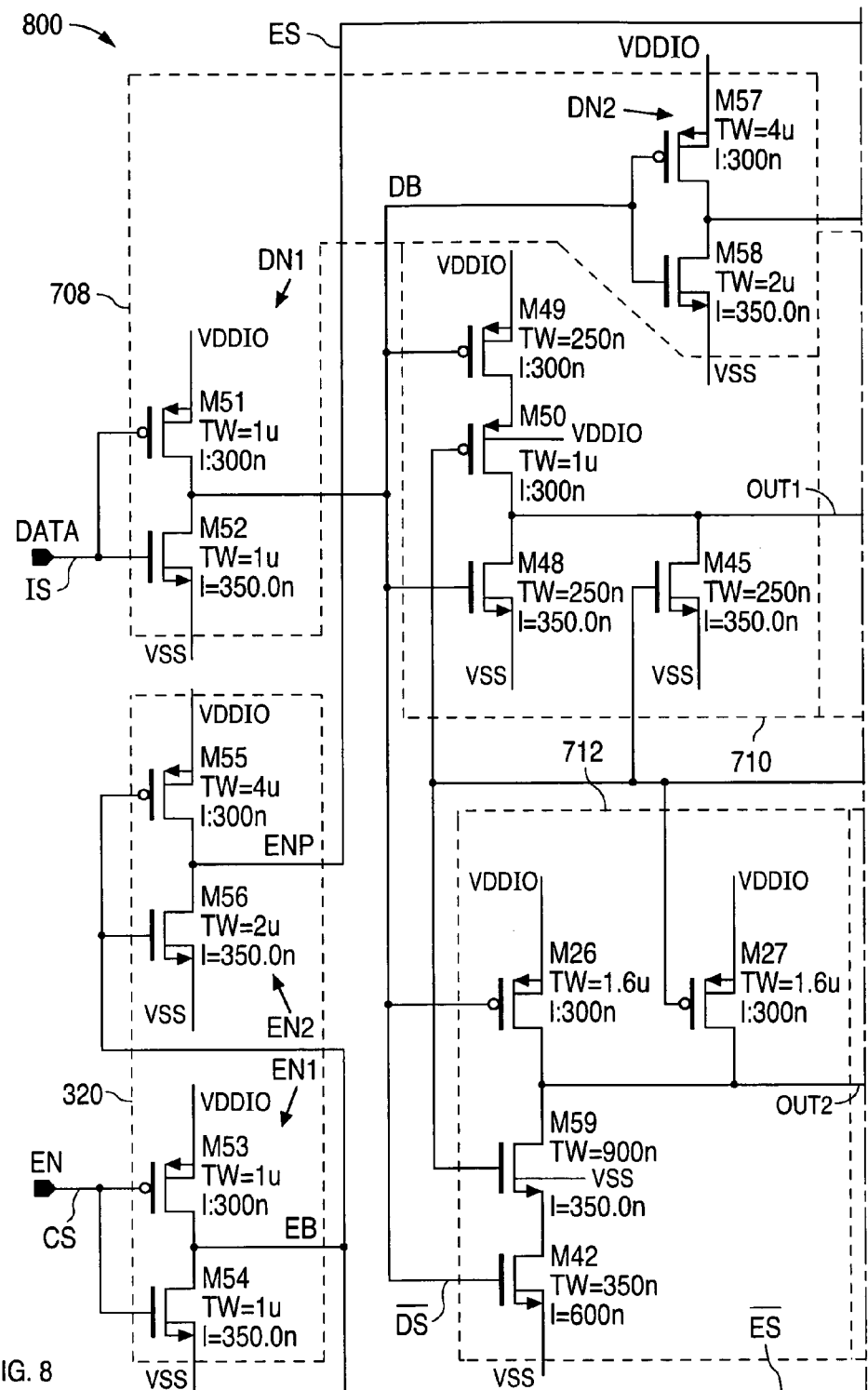
FIGS. 8A and 8B are schematic diagrams illustrating a driver circuit 800 that represents an example of an implementation of driver circuit 700 in accordance with the present invention.
Figure 8B:
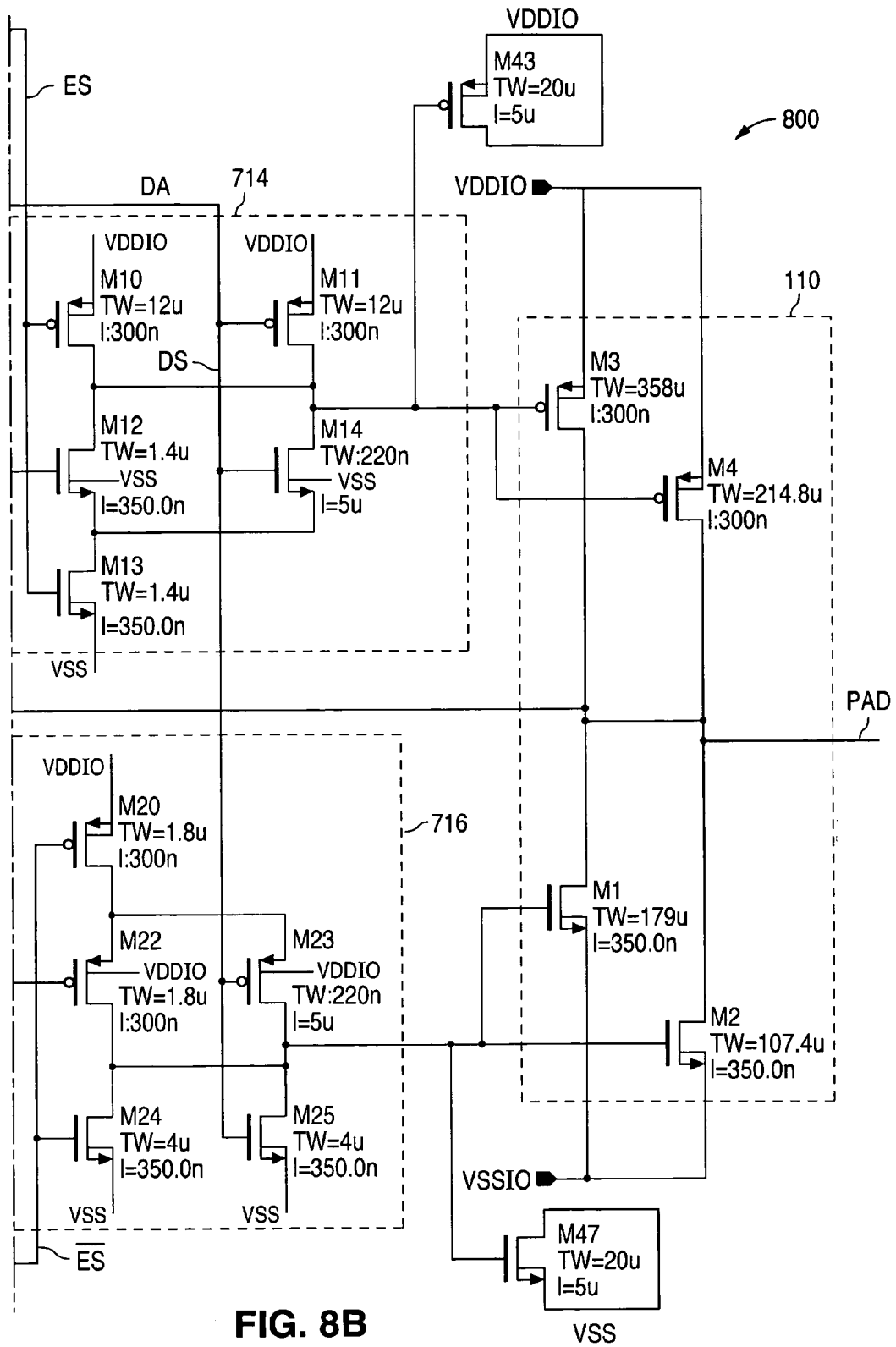

FIGS. 8A and 8B show schematic diagrams that illustrate a driver circuit 800 that represents an example of an implementation of driver circuit 700 in accordance with the present invention. As shown in FIGS. 8A and 8B, driver circuit 800 implements output driver 110 with two p-channel output transistors M3 and M4 in lieu of transistor P1, and two n-channel output transistors M1 and M2 in lieu of transistor N1.

The output transistors M3 and M4 both have a source connected to the supply voltage VDDIO, a drain connected to the output node PAD, and a gate. The output transistors M1 and M2 both have a source connected to VSSIO, a drain connected to the output node PAD, and a gate. (Output driver 110 of driver circuit 800 can alternately be formed with a single p-channel transistor and a single n-channel transistor.)

As further shown in the FIGS. 8A and 8B example, driver circuit 800 implements trip point circuit 710 with transistor M45, transistor M48, transistor M49, and transistor M50. Transistor M45 has a source connected to VSS, and a gate connected to the output node PAD. Transistor M48 has a source connected to VSS, a drain connected to the drain of transistor M45, and a gate connected to a data node DB.

Transistor M49 has a source connected to the supply voltage VDDIO, and a gate connected to the data node DB. Transistor M50 has a source connected to the drain of transistor M49, a drain connected to the drain of transistor M45, and a gate connected to the output node PAD.

Further, driver circuit 800 implements trip point circuit 712 with transistor M26, transistor M27, transistor M42, and transistor M59. Transistor M26 has a source connected to the supply voltage VDDIO, and a gate connected to the data node DB. Transistor M27 has a source connected to the supply voltage VDDIO, a drain connected to the drain of transistor M26, and a gate connected to the output node PAD.

In addition, transistor M42 has a source connected to VSS, and a gate connected to the data node DB. Transistor M59 has a source connected to the drain of transistor M42, a drain connected to the drain of transistor M26, and a gate connected to the output node PAD.

Driver circuit 800 implements first control circuit 714 with transistors M10, M11, M12, M13, and M14. Transistor M10 has a source connected to the supply voltage VDDIO, a drain connected to the gates of the output transistors M3 and M4, and a gate connected to an enable node ENP. Transistor M11 has a source connected to the supply voltage VDDIO, a drain connected to the gates of the output transistors M3 and M4, and a gate connected to a data node DA.

Transistor M12 has a source, a drain connected to the gates of the output transistors M3 and M4, and a gate connected to the output of trip point circuit 710. Transistor M13 has a source connected to VSS, a drain connected to the source of transistor M12, and a gate connected to the enable node ENP. Transistor M14 has a source connected to the source of transistor M12, a drain connected to the gates of the output transistors M3 and M4, and a gate connected to the data node DA. (Decreasing W/L of transistor M14 causes the output transistors M3 and M4 to move more slowly to lower impedance. A lower impedance, in turn, produces more overshoot.)

As shown in FIGS. 8A and 8B, driver circuit 800 implements second control circuit 716 with transistors M20, M22, M23, M24, and M25. Transistor M20 has a source connected to the supply voltage VDDIO, and a gate connected to an enable node EB. Transistor M22 has a source connected to the drain of transistor M20, a drain connected to the gates of the output transistors M1 and M2, and a gate connected to the output of trip point circuit 712.

Transistor M23 has a source connected to the source of transistor M22, a drain connected to the gates of the output transistors M1 and M2, and a gate connected to the data node DA. Transistor M24 has a source connected to VSS, a drain connected to the gates of the output transistors M1 and M2, and a gate connected to enable node EB. Transistor M25 has a source connected to VSS, a drain connected to the gates of the output transistors M1 and M2, and a gate connected to the data node DA.

In addition, driver circuit 800 implements inversion circuit 320 with two inverters EN1 and EN2 to generate the enable signal ES and the inverted enable signal ESbar. Inverter EN1 has an input connected to an enable node EN, and an output connected to the enable node EB. Inverter EN2 has an input connected to the enable node EB, and an output connected to the enable node ENP. Thus, when the control signal CS is a logic high, the logic state on the enable node EB is a logic low, while the logic state on the enable node ENP is a logic high.

Further, driver circuit 800 implements inversion circuit 708 with inverters DN1 and DN2. Inverter DN1 has an input connected to a data node DATA, and an output connected to the data node DB. Inverter DN2 has an input connected to the data node DB, and an output connected to the data node DA. Thus, when the logic state of the input signal IS is low, the logic state on the data node DA is also low. When the logic state of the input signal IS is high, the logic state on the data node DA is also high.

Lower widths for transistors M49 and M50 lower the trip point voltage which, in turn, leads to a higher driver impedance. Lower widths for transistors M59 and M42 raise the trip point which, in turn, leads to a higher driver impedance. A strong PMOS makes a high trip point and a strong NMOS makes a low trip point because at the input trip voltage condition, a stronger device does not need its gate-to-source voltage input to be driven as hard.

When the trip is occurring, inverted data signal DS is either at VSS or VDDIO. As a result, transistors M26 and M48 are turned off, while transistors M42 and M49 are turned on hard with the absolute value of the gate-to-source voltage equal to the supply voltage VDDIO. The trip point of trip point circuit 710 is set by the strength ratio of transistor M50 to transistor M45. The trip point of trip point circuit 712 is set by the strength ratio of transistor M27 to transistor M59.

Lowering the width of transistor M50 lowers the trip point voltage of circuit 710 which, in turn, increases the impedance of output transistors M3 and M4. Lowering the width of transistor M59 raises the trip point voltage of circuit 712 which, in turn, increases the impedance of output transistors M1 and M2. Transistors M42 and M49 have a lesser effect on the trip point since the gate-to-source voltage of these transistors has them fully turned on.

To operate, the control signal CS is set to a logic high. Following the inversion of inverter EN1, inversion circuit 320 outputs the inverted enable signal ESbar with a logic low to turn on transistor M20, and turn off transistor M24. In addition, following the inversion of inverters EN1 and EN2, inversion circuit 320 outputs the enable signal ES with a logic high that turns off transistor M10, and turns on transistor M13.

In operation, assume the logic state of the input signal IS is low, and the voltage on the output node PAD is low. When the logic state of the input signal IS is low, following the inversion of inverter DN1, inversion circuit 708 transmits the inverted data signal DSbar with a logic high to the gates of transistor M42 and transistor M48, thereby turning on transistor M42 and transistor M48, and to the gates of transistors M26 and M49, thereby turning off transistors M26 and M49.

In addition, following the inversions of inverters DN1 and DN2, inversion circuit 708 transmits the data signal DS with a logic low to the gates of transistor M11 and transistor M23, thereby turning on transistor M11 and transistor M23, and to the gates of transistors M14 and M25, thereby turning off transistors M14 and M25. As a result, transistor M11 sources a current to the gates of the output transistors M3 and M4 which, in turn, turns off the output transistors M3 and M4. In addition, transistors M20 and M23 source a current to the gates of the output transistors M1 and M2 which, in turn, turns on the output transistors M1 and M2.

When the voltage on the output node PAD is low, a logic low is placed on the gates of transistor M45 and M50 of trip point circuit 710, turning off transistor M45 and turning on transistor M50. Trip point circuit 710, however, can not source any current to the gate of transistor M12 via transistor M50 because transistor M49 is turned off. As a result, transistor M48 pulls the voltage on the gate of transistor M12 to ground, which turns off transistor M12. Thus, the trip point signal OUT1 is output as a logic low.

In addition, when the logic state on the output node PAD is low, a logic low is placed on the gates of transistor M27 and M59 of trip point circuit 712, turning on transistor M27 and turning off transistor M59. As a result, transistor M27 pulls the voltage on the gate of transistor M22 up to the supply voltage VDDIO, which turns off transistor M22. Thus, the trip point signal OUT2 is output as a logic high.

When the logic state of the input signal IS then changes from a logic low to a logic high, the logic state of the data signal DS changes from a logic low to a logic high, and the logic state of the inverted data signal DSbar changes from a logic high to a logic low. These inputs turn on transistor M26 and turn off transistor M42 following the inversion of inverter DN1, leaving the logic state of the trip point signal OUT2 as a logic high. Further, following the inversion of inverter DN2, transistor M23 turns off and transistor M25 turns on. As a result, transistor M25 pulls the gates of the output transistors M1 and M2 to ground which, in turn, turns off the output transistors M1 and M2.

At the same time, transistor M48 turns off and transistor M49 turns on following the inversion of inverter DN1. The turn on of transistor M49 enables trip point circuit 710 which, in turn, pulls up the logic state of the trip point signal OUT1 on the gate of transistor M12 to a logic high, turning on transistor M12. In addition, transistor M11 turns off and transistor M14 turns on in response to the data signal DS. As a result, transistors M12, M13, and M14 sink a current from the gates of the output transistors M3 and M4 to pull the voltage on the gates of the output transistors M3 and M4 down, thereby turning on the output transistors M3 and M4.

When the output transistors M3 and M4 turn on, the output transistors M3 and M4 source a current into the output node PAD that raises the voltage on the output node PAD. If trip point circuit 710 is formed to have a trip point voltage of 0.4 VDDIO, then transistor M45 turns on and transistor M50 turns off when the voltage on the output node PAD rises above 0.4 VDDIO to indicate that the voltage on the output node PAD is now greater than the first trip point voltage. Transistor M45 then pulls down the logic state of the trip point signal OUT1 from a logic high to a logic low, thereby turning off transistor M12.

When transistor M12 turns off, the magnitude of the current sunk from the gates of the output transistors M3 and M4 is reduced. Since transistors M13 and M14 remain turned on, the transistors M13 and M14 continue to pull down the voltage on the gates of the output transistors M3 and M4, but at a slower rate. In accordance with the present invention, transistor M12 is formed to be substantially stronger than transistor M14.

Thus, when transistors M12 and M14 are both turned on, transistors M12 and M14 pull the voltage on the gates of the output transistors M3 and M4 down which, in turn, causes the voltage on output node PAD to rise to 0.4 VDDIO. However, when transistor M12 turns off, transistor M14 continues to pull down the voltage, but at a much slower rate.

As a result, trip point circuit 710 functions as a NOR gate that inputs the logic states of the output node PAD and the inverted data signal DSbar, and outputs the trip point signal OUT1 with a logic state defined by the NOR function. In addition, first control circuit 714 functions as a modified NAND gate that inputs the logic states of the enable signal ES and the data signal DS, and outputs a voltage to the gates of the output transistors M3 and M4 that is defined by the modified NAND circuitry. Modified NAND gate 714 also inputs the logic state of the trip point signal OUT1, not as a logic input, but as an input that varies the strength of the pull down by controlling the on and off state of transistor M12.

Assume that the voltage on the output node PAD is low, the data signal DS is low, the inverted data signal DSbar is high, and the enable signal ES is high. When the output node PAD is low and the inverted data signal DSbar is high, NOR gate 710 outputs the trip point signal OUT1 as a logic low. When the data signal DS is low and the enable signal ES is high, modified NAND gate 714 outputs a high voltage that turns off the output transistors M3 and M4.

When the data signal DS changes to a logic high and the inverted data signal changes to a logic low, the low on the output node PAD and the low of the inverted data signal DSbar cause NOR gate 710 to output the trip point signal OUT1 as a logic high. When the data signal DS is high and the enable signal ES is high, modified NAND gate 714 pulls down the voltage on the gates of the output transistors M3 and M4 to a logic low via strong transistor M12 and weak transistor M14.

When the voltage on the output node PAD rises above the trip point voltage which, in turn, causes the logic state of the output node PAD to change from low to high, NOR gate 710 again outputs the trip point signal OUT1 as a logic low. Changing the logic state of the trip point signal OUT1 to a logic low does not change the logical output of modified NAND gate 714, but the change does turn off strong transistor M12.

Turning off strong transistor M12 changes the rate that the voltage on the gates of the output transistors M3 and M4 is pulled down which, in turn, changes the rate that the voltage on the output node PAD is pulled up. As a result, the weak transistor M14 primarily holds the output transistors M3/M4 on after the strong transistor M12 and the weak transistor M14 initially turned on the output transistors M3/M4 when the data signal DS changed state.

Thus, the voltage on the gates of the output transistors M3 and M4 falls at a first rate, and then falls at a second slower rate. As a result, the impedance of driver circuit 800 is made to match the impedance of the transmission line for a duration of up to three or more one-way time delays of the transmission line.

Therefore, in accordance with the present invention, the voltage of the initial wave front launched by the output transistors M3 and M4 down the transmission line has a value of approximately 0.5 VDDIO. When the initial wave front reaches a receiver that appears as an open circuit, 100% of the wave front is reflected back positively to driver circuit 800.

As a result, immediately following the reflection, the voltage at the input of the receiver is equal to approximately VDDIO. In addition, after a time delay, the reflected wave front reaches driver circuit 800 with a voltage of approximately VDDIO. Further, when the voltage on the initial signal wave front is equal to 0.5 VDDIO, the impedances of the driver and transmission line are nearly matched. In this case, none of the reflected wave front received by driver circuit 800 is reflected back again to the receiver. Thus, driver circuit 800 provides a full voltage signal at the receiver without generating a reflected wave front that can damage the receiver or the driver.

Assume that the logic state of the input signal IS is high, and the voltage on the output node PAD is high. When the logic state of the input signal IS is high, following the inversion of inverter DN1, inversion circuit 708 transmits the inverted data signal DSbar with a logic low to the gates of transistor M42 and transistor M48, thereby turning off transistor M42 and transistor M48, and to the gates of transistors M26 and M49, thereby turning on transistors M26 and M49.

In addition, when the voltage on the output node PAD is high, a logic high is placed on the gates of transistor M45 and M50 of trip point circuit 710. As a result, transistors M45 pulls the voltage on the gate of transistor M12 to ground, which turns off transistor M12. Thus, the logic state of the trip point signal OUT1 output to transistor M12 is low.

In addition, when the logic state on the output node PAD is high, a logic high is placed on the gates of transistor M27 and M59 of trip point circuit 712, turning off transistor M27 and turning on transistor M59. However, transistor M59 can not sink a current from the gate of transistor M22 because transistor M42 is turned off. As a result, transistor M26 sources a current to the gate of transistor M22 to turn transistor M22 off. Thus, the logic state of the trip point signal OUT2 output to transistor M22 is high.

Further, following the inversions of inverters DN1 and DN2, inversion circuit 708 transmits the data signal DS with a logic high to the gates of transistor M11 and transistor M23, thereby turning off transistor M11 and transistor M23, and to the gates of transistors M14 and M25, thereby turning on transistors M14 and M25. As a result, transistor M13 and transistor M14 sink a current from the gates of the output transistors M3 and M4 which, in turn, turns on the output transistors M3 and M4. In addition, transistor M25 sinks a current from the gates of the output transistors M1 and M2 which, in turn, turns off the output transistors M1 and M2.

When the logic state of the input signal IS then changes from a logic high to a logic low, the logic state of the data signal DS changes from a logic high to a logic low, and the logic state of the inverted data signal DSbar changes from a logic low to a logic high. These inputs turn off transistor M49 following the inversion of inverter DN1 and disable trip point circuit 710. In addition, transistor M48 turns on which, in turn, places a logic low on the gate of transistor M12, turning off transistor M12 and maintaining the logic state of the trip point signal OUT1 as a low.

Further, following the inversion of inverter DN2, transistor M11 turns on and transistor M14 turns off. As a result, transistor M11 sources a current to the gates of the output transistors M3 and M4 to raise the voltage on the gates of the output transistors M3 and M4, thereby turning off the output transistors M3 and M4.

At the same time, transistor M26 turns off and transistor M42 turns on following the inversion of inverter DN1, and enables trip point circuit 712. As result, transistors M42 and M59 pull down the voltage of the trip point signal OUT2 on the gate of transistor M22 to a logic low, turning on transistor M22.

Further, following the inversion of inverter DN2, transistor M23 turns on and transistor M25 turns off in response to the data signal DS. As a result, transistors M20, M22, and M23 source a current into the gates of the output transistors M1 and M2 to pull the voltage on the gates of the output transistors M1 and M2 up, thereby turning on the output transistors M1 and M2.

When the output transistors M1 and M2 turn on, the output transistors M1 and M2 sink a current from the output node PAD that lowers the voltage on the output node PAD. If trip point circuit 712 is formed to have a trip point voltage of 0.6

VDDIO, then transistor M27 turns on and transistor M59 turns off when the voltage on the output node PAD falls below 0.6 VDDIO to indicate that the voltage on the output node PAD is now less than the second trip point voltage. Transistor M27 then pulls the logic state of the trip point signal OUT2 from a logic low to a logic high, thereby turning off transistor M22.

When transistor M22 turns off, the magnitude of the current sourced into the gates of the output transistors M1 and M2 is reduced. Since transistor M23 remains turned on, transistor M23 continues to pull up the voltage on the gates of the output transistors M1 and M2, but at a slower rate. In accordance with the present invention, transistor M22 is formed to be substantially stronger than transistor M23.

Thus, when transistors M22 and M23 are both turned on, transistors M22 and M23 raise the voltage on the gates of the output transistors M1 and M2 which, in turn, causes the voltage on output node PAD to fall to 0.6 VDDIO. However, when transistor M22 turns off, transistor M23 continues to pull up the voltage on the gates of the output transistors M1 and M2, but at a much slower rate.

As a result, trip point circuit 712 functions as a NAND gate that inputs the logic states of the output node PAD and the inverted data signal DSbar, and outputs the trip point signal OUT2 with a logic state defined by the NAND function. In addition, second control circuit 716 functions as a modified NOR gate that inputs the logic states of the inverted enable signal ESbar and the data signal DS, and outputs a voltage to the gates of the output transistors M1 and M2 that is defined by the modified NOR circuitry. Modified NOR gate 716 also inputs the logic state of the trip point signal OUT2, not as a logic input, but as an input that varies the strength of the pull up by controlling the on and off state of transistor M22.

Assume that the voltage on the output node PAD is high, the data signal DS is high, the inverted data signal DSbar is low, and the inverted enable signal ESbar is low. When the output node PAD is high and the inverted data signal DSbar is low, NAND gate 712 outputs the trip point signal OUT2 as a logic high. When the data signal is high and the inverted enable signal ESbar is low, modified NOR gate 716 outputs a low voltage that turns off the output transistors M1 and M2.

When the data signal DS changes to a logic low and the inverted data signal changes to a logic high, the high on the output node PAD and the high of the inverted data signal DSbar cause NAND gate 712 to output the trip point signal OUT2 as a logic low. When the data signal DS is low and the inverted enable signal ESbar is low, modified NOR gate 716 pulls up the voltage on the gates of the output transistors M1 and M2 to a logic high via strong transistor M22 and weak transistor M23. This turns on output transistors M1 and M2 which, in turn, pulls down the voltage on the output node PAD.

When the voltage on the output node PAD falls below the trip point voltage which, in turn, causes the logic state of the output node PAD to change from high to low, NAND gate 712 changes the logic state of the trip point signal OUT2 from a logic low to a logic high. Changing the logic state of the trip point signal OUT2 to a logic high does not change the logical output of modified NOR gate 716, but the change does turn off strong transistor M22. Turning off strong transistor M22 changes the rate that the voltage on the gates of the output transistors M1 and M2 is pulled up which, in turn, changes the rate that the voltage on the output node PAD is pulled down. As a result, the weak transistor M23 primarily holds the output transistors M1/M2 on after the strong transistor M22 and the weak transistor M23 initially turned on the output transistors M1/M2 when the data signal DS changed state.

Thus, the voltage on the gates of the output transistors M1 and M2 rises at a first rate, and then rises at a second slower rate. As a result, the impedance of driver circuit 800 is made to match the impedance of the transmission line for a duration of up to three or more one-way time delays of the transmission line.

Therefore, in accordance with the present invention, the voltage of the initial wave front launched by the output transistors M1 and M2 down the transmission line has a value of approximately 0.5 VDDIO. When the initial wave front reaches the receiver, 100% of the wave front is reflected back to driver circuit 800. As a result, immediately following the reflection, the voltage at the input of the receiver is equal to ground. In addition, after a time delay, the reflected wave front reaches driver circuit 800 as ground.

In addition, as shown in FIGS. 8A and 8B, driver circuit 800 can optionally include transistors M43 and M47. Transistor M43 has a source, drain, and body connected to the supply voltage VDDIO, and a gate connected to the gates of the output transistors M3 and M4. Transistor M47 has a source, drain, and body connected to VSS, and a gate connected to the gates of the output transistors M1 and M2. Like driver circuit 400, transistors M43 and M47 of driver circuit 800 add gate-to-source capacitance to hold the gate-to-source voltages of the output transistors at a more stable value.

Figure 9A:
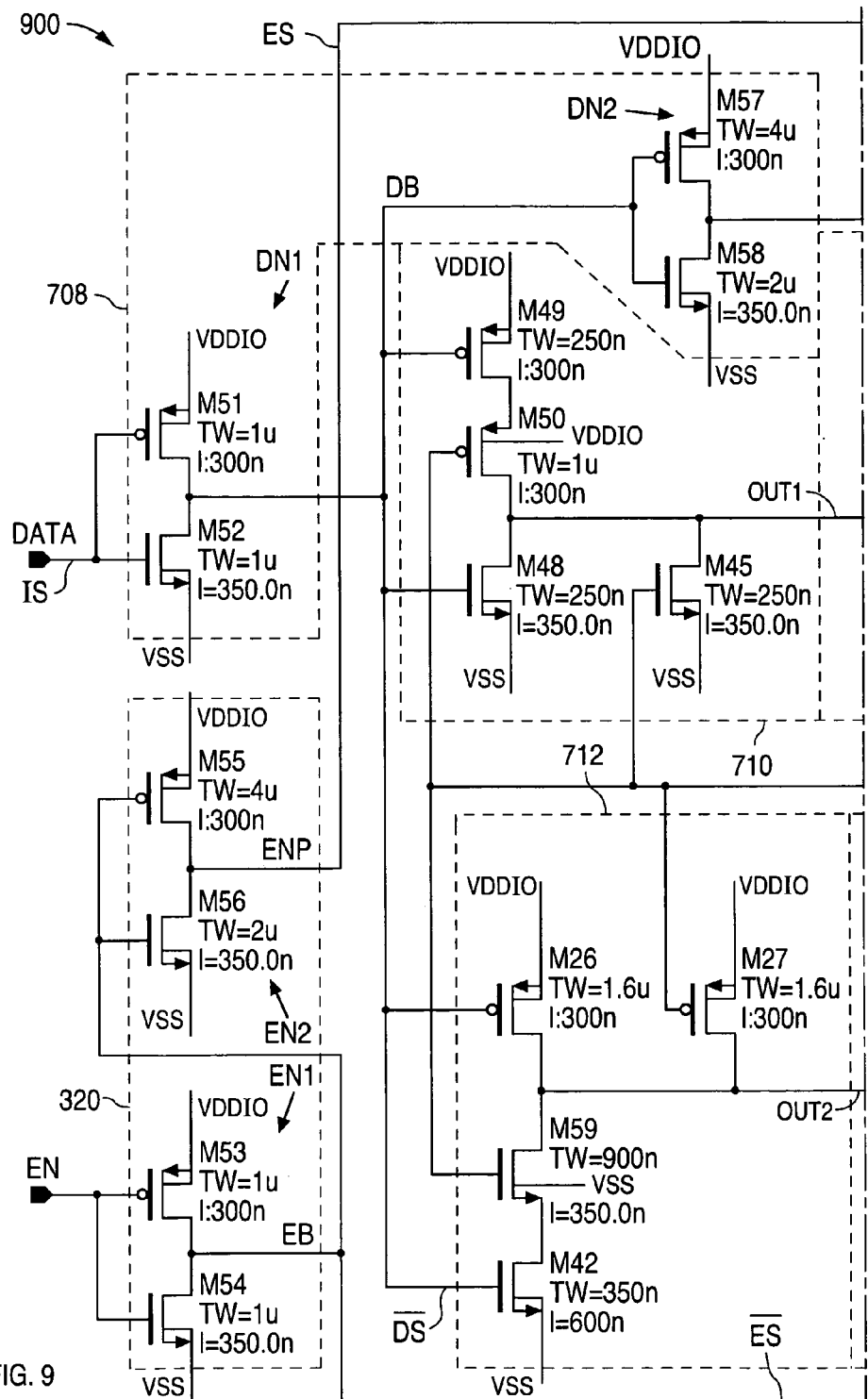
FIGS. 9A and 9B are schematic diagrams illustrating a driver circuit 900 that represents an example of an alternate embodiment of driver circuit 800 in accordance with the present invention.
Figure 9B:
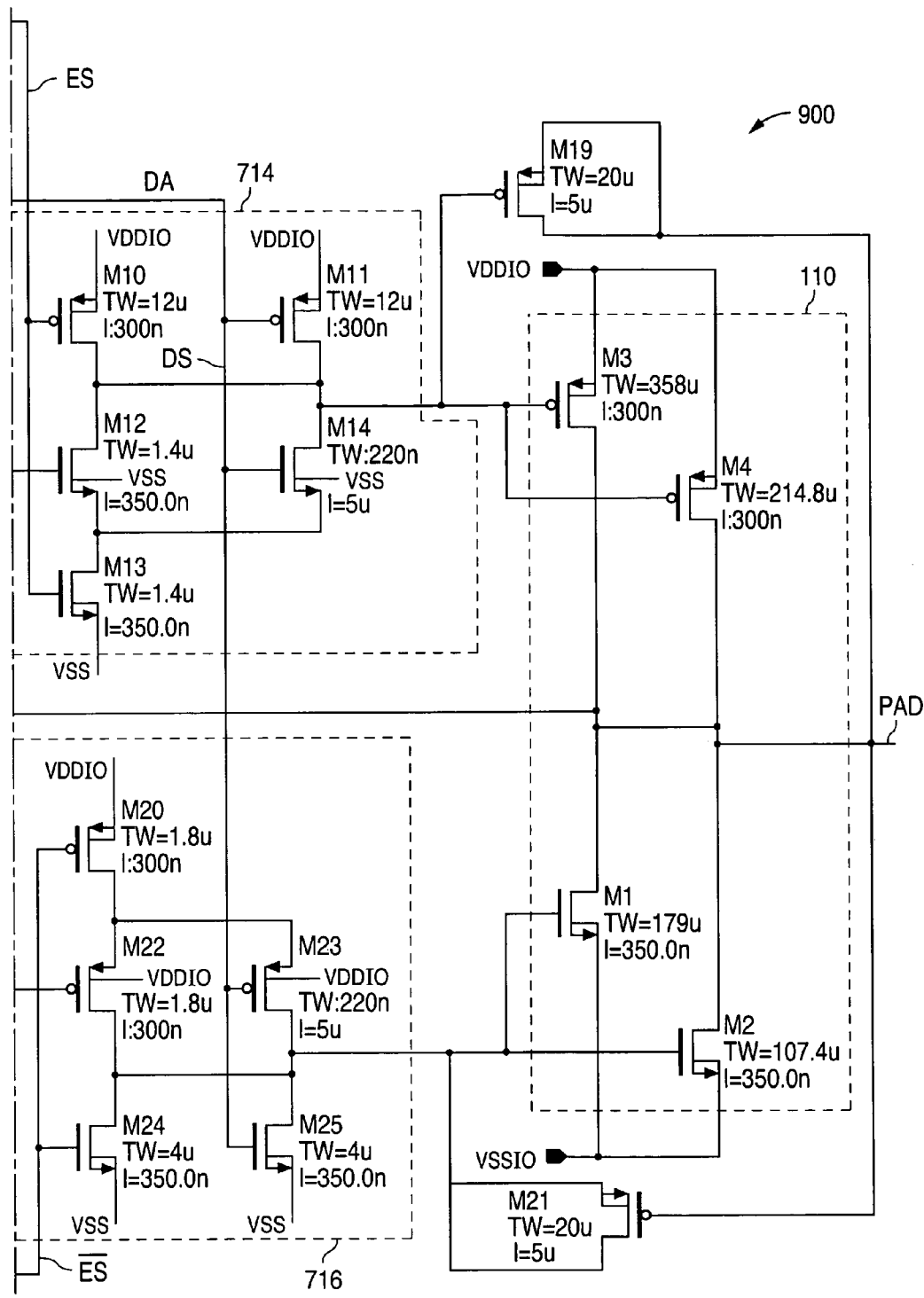

FIGS. 9A and 9B show schematic diagrams that illustrate a driver circuit 900 that represents an example of an alternate embodiment of driver circuit 800 in accordance with the present invention. Driver circuit 900 is similar to driver circuit 800 and, as a result, utilizes the same reference numerals to designate the structures which are common to both drivers.

As shown in FIGS. 9A and 9B, driver circuit 900 differs from driver circuit 900 in that driver circuit 900 includes p-channel transistor M19 and n-channel transistor M21 in lieu of transistors M43 and M47. Transistors M19 and M20 are connected the same as transistors M19 and M20 in FIGS. 5A and 5B, and operate in the same way to reduce the rise and fall time variations due to variations in capacitive loading which, in turn, provides a more constant slew rate.

Figure 10A:
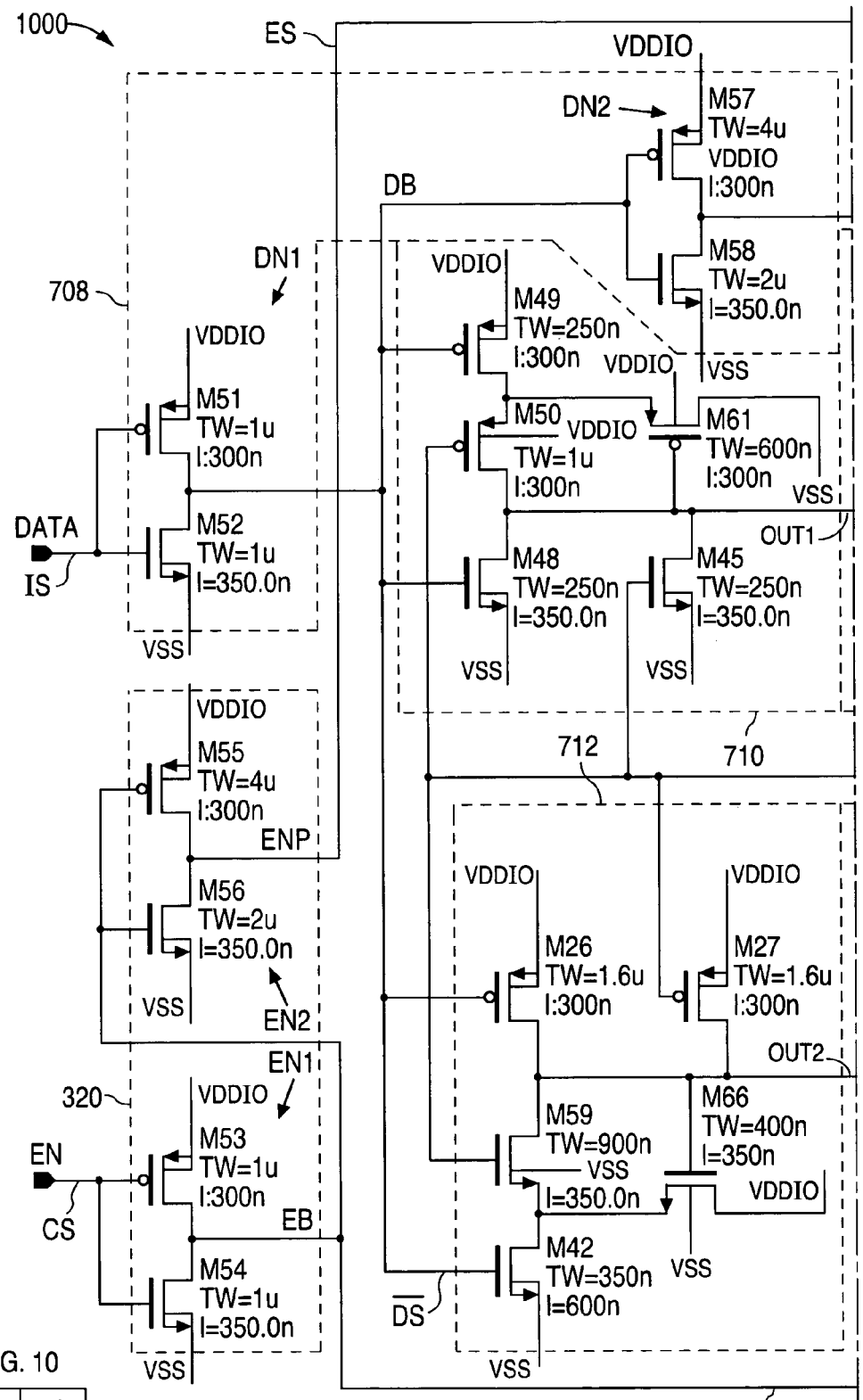
FIGS. 10A and 10B are schematic diagrams illustrating a driver circuit 1000 that represents an example of an alternate embodiment of driver circuit 800 in accordance with the present invention.
Figure 10B:
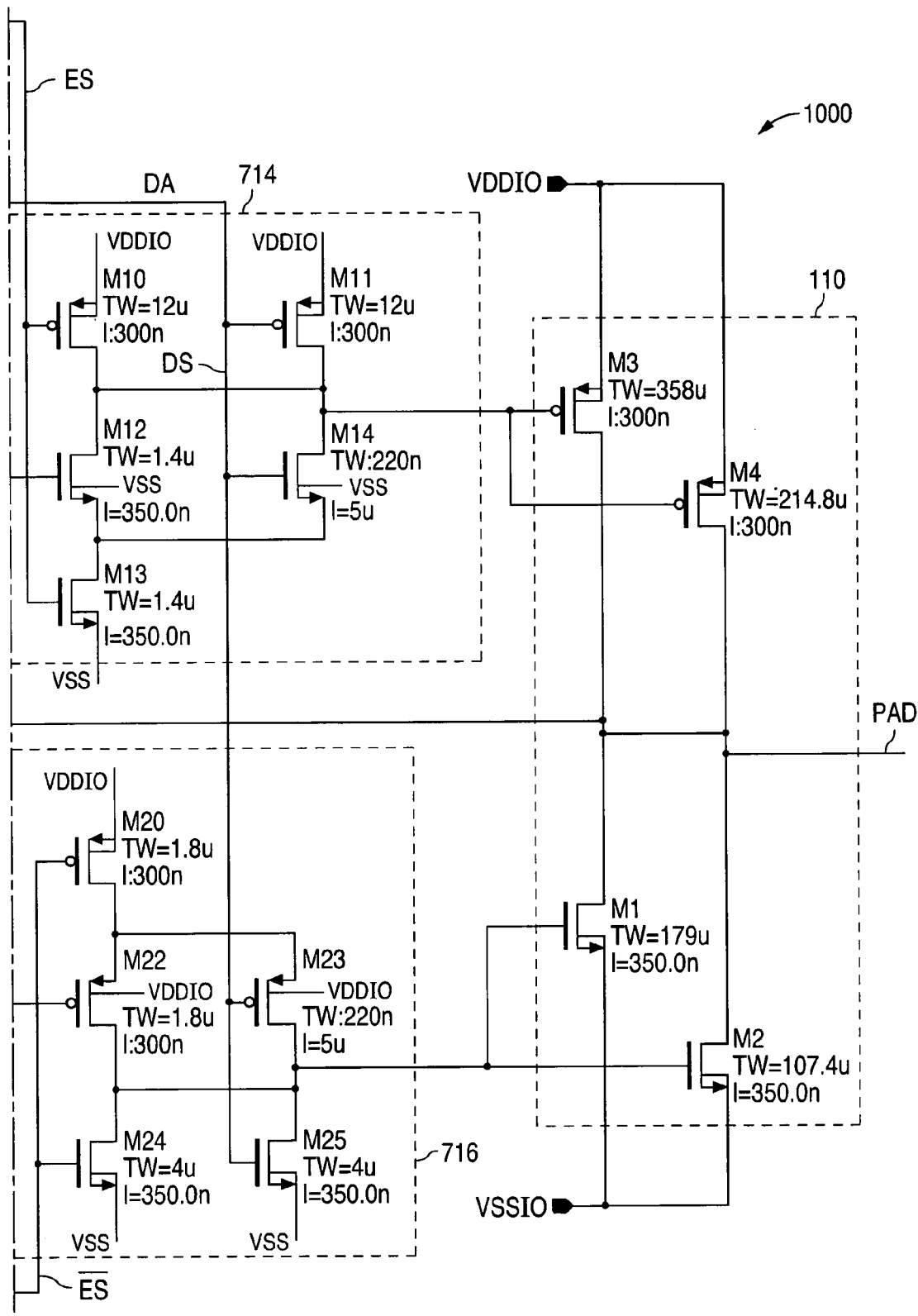

FIGS. 10A and 10B show schematic diagrams that illustrate a driver circuit 1000 that represents an example of an alternate embodiment of driver circuit 800 in accordance with the present invention. Driver circuit 1000 is similar to driver circuit 800 and, as a result, utilizes the same reference numerals to designate the structures which are common to both drivers.

As shown in FIGS. 10A and 10B, driver circuit 1000 differs from driver circuit 800 in that driver circuit 1000 adds hysterisis by including a p-channel transistor M61, and an n-channel transistor M66. Transistor M61 has a source connected to the source of transistor M50, a drain connected to VSS, and a gate connected to the drains of transistors M48 and M50. Transistor M66 has a source connected to the source of transistor M59, a drain connected to the power supply voltage VDDIO, and a gate connected to the drains to transistors M26 and M59.

In operation, driver circuit 1000 operates the same as driver circuit 800 when the output node PAD is connected to an open circuit via the transmission line. However, driver circuit 1000 operates differently when the output node PAD is connected to a large capacitive load.

Like driver circuit 600, driver circuit 1000 reduces this effect. When the voltage on the output node PAD is ground, transistor M61 is turned off and driver 1000 operates in a manner similar to driver circuit 800, launching an initial wave front down the transmission line with a value of approximately 0.5 VDDIO.

However, as the voltage on the output of trip point circuit 710 falls, transistor M61 turns on which, in turn, limits the magnitude of the current that can be sourced into the output of trip point circuit 710. If a reflected wave front is received from a capacitive load that has a value of, for example, 0.2 VDDIO, then the logic state of the trip point signal OUT1 output from trip point circuit 710 changes states which, in turn, again causes transistor M12 to turn on.

When transistor M12 turns on, the output transistors M3 and M4 source more current into the output node PAD, thereby raising the voltage on the output node PAD. However, because transistor M61 is on, transistor M45 is able to sink more current from the output of trip point circuit 710 than can be supplied by transistor M50. This, in turn, effectively reduces the trip point of trip point circuit 710 to, for example, 0.3 VDDIO.

Thus, transistor M61 has the effect of reducing the trip point voltage of trip point circuit 710 from 0.4 VDDIO to, for example, 0.3 VDDIO when trip point circuit 710 changes the logic state of trip point signal OUT1 again in response to a reflected wave front. Reducing the trip point voltage, in turn, reduces the magnitude of the second wave front that is launched down the transmission line which, in turn, reduces the overdrive.

Transistor M66 operates in a similar manner, and has the effect of increasing the trip point voltage of trip point circuit 712 from 0.6 VDD to, for example, 0.7 VDD. Thus, driver circuit 600 limits the effect of a reflected wave front when the initial wave front is launched down a transmission line that is connected to a large capacitive load. (Driver circuit 1000 can also be implemented with the negative feedback transistors M19 and M21 illustrated in FIGS. 9A and 9B.)

As noted above, the weak transistor M14 primarily holds the output transistors M3/M4 on after the strong transistor M12 and the weak transistor M14 initially turned on the output transistors M3/M4 when the data signal DS changed state. Similarly, the weak transistor M23 primarily holds the output transistors M1/M2 on after the strong transistor M22 and the weak transistor M23 initially turned on the output transistors M1/M2 when the data signal DS changed state. The holding on of the output transistors M1/M2 and M3/M4 can be made tolerant to noise on the output node PAD by adding the gate-to-source capacitance provided by transistors M43 and M47 as in FIG. 8 and/or by adding hysterisis as in FIG. 10.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A driver circuit comprising:
an output driver connected to an output node, the output driver having a first output transistor that sources current to the output node when turned on, and a second output transistor that sinks current from the output node when turned on;
a trip point circuit having an input connected to the output node, and an output, the trip point circuit having a trip point voltage;
a first control circuit having a first input connected to receive a data signal, a second input connected to the trip point circuit, and an output connected to the first output transistor; and
a second control circuit having a first input, a second input connected to the trip point circuit, and an output connected to the second output transistor,
when the data signal changes from a first logic state to a second logic state while a voltage on the output node lies below the trip point voltage, the first control circuit sinks a first current with a first positive magnitude from the first output transistor to pull up the voltage on the output node, and with a second positive magnitude after the voltage on the output node rises above the trip point voltage, the second positive magnitude being less than the first positive magnitude.

2. The driver circuit of claim 1 wherein
the second inputs of the first and second control circuits are connected to the output of the trip point circuit,
the first input of the second control circuit receives the data signal,
when the data signal has the first logic state and the output node has a first voltage level, the first control circuit turns off the first output transistor, and the second control circuit turns on the second output transistor; and
when the data signal changes from the first logic state to the second logic state, the second control circuit sinks a second current from the second output transistor to turn off the second output transistor.

3. The driver circuit of claim 2 wherein when the data signal changes from the second logic state to the first logic state,
the first control circuit sources a third current to the first output transistor to turn off the first output transistor; and
the second control circuit sources a fourth current to the second output transistor to pull down the voltage on the output node, and reduces a magnitude of the fourth current sourced to the second output transistor after the voltage on the output node falls below the trip point voltage of the trip point circuit.

4. The driver circuit of claim 1 wherein the trip point circuit is an inverting circuit with an input connected to the output node, and an output connected to the first and second control circuits.

5. The driver circuit of claim 4 wherein
the second inputs of the first and second control circuits are connected to the output of the trip point circuit,
the first input of the second control circuit receives the data signal,
when the data signal has the first logic state and the output node has a first voltage level, the first control circuit turns off the first output transistor, and the second control circuit turns on the second output transistor; and
when the data signal changes from the first logic state to the second logic state, the second control circuit sinks a second current from the second output transistor to turn off the second output transistor.

6. The driver circuit of claim 5 wherein when the data signal changes from the second logic state to the first logic state,
the first control circuit sources a third current to the first output transistor to turn off the first output transistor; and
the second control circuit sources a fourth current to the second output transistor to pull down the voltage on the output node, and reduces a magnitude of the fourth current sourced to the second output transistor after the voltage on the output node falls below the trip point voltage of the trip point circuit.

7. The driver circuit of claim 1 wherein the trip point circuit includes a first trip circuit and a second trip circuit, the first trip circuit having an input connected to the output node, an output connected to the second input of the first control circuit, and a first trip point voltage, the second trip circuit having an input connected to the output node, an output connected to the second input of the second control circuit, and a second trip point voltage higher than the first trip point voltage.

8. The driver circuit of claim 7 wherein
the first input of the second control circuit receives the data signal,
when the data signal has the first logic state and the output node has a first voltage level, the first control circuit turns off the first output transistor, and the second control circuit turns on the second output transistor; and
when the data signal changes from the first logic state to the second logic state, the second control circuit sinks a second current from the second output transistor to turn off the second output transistor.

9. The driver circuit of claim 8 wherein when the data signal changes from the second logic state to the first logic state,
the first control circuit sources a third current to the first output transistor to turn off the first output transistor; and
the second control circuit sources a fourth current to the second output transistor to pull down the voltage on the output node, and reduces a magnitude of the fourth current sourced to the second output transistor after the voltage on the output node falls below the second trip point voltage.

10. The driver circuit of claim 7 and further comprising a data inversion circuit having an input, a first output connected to the first input of the first control circuit, and a second output connected to the first input of the second control circuit, the data inversion circuit transmitting the data signal to the first control circuit, and an inverted data signal to the second control circuit, the data signal and the inverted data signal having opposite logic states.

11. The driver circuit of claim 10 wherein
the data signal has the first logic state, the inverse data signal has the second logic state, and the output node has a first voltage level, the first control circuit turns off the first output transistor, and the second control circuit turns on the second output transistor; and
when the data signal changes from the first logic state to the second logic state and the inverse data signal changes from the second logic state to the first logic state, the second control circuit sinks a second current from the second output transistor to turn off the second output transistor.

12. The driver circuit of claim 7 wherein the first trip circuit includes a first trip point lowering circuit, and the second trip circuit includes a second trip point raising circuit.

13. The driver circuit of claim 7 wherein an inverted data signal is input to the first and second trip circuits.

14. The driver circuit of claim 1 and further comprising an enable inversion circuit having an input, a first output connected to the first control circuit, and a second output connected to the second control circuit, the enable inversion circuit generating an enable signal on the first output and an inverted enable signal on the second output in response to a logic state of a signal on the input of the enable inversion circuit.

15. The driver circuit of claim 14 wherein
when the enable signal has a first logic state and the inverted enable signal has a second logic state, the first and second control circuits respond to changes in the logic state of the data signal, and
when the enable signal has the second logic state and the inverted enable signal has the first logic state, the first and second control circuits fail to respond to changes in the logic state of the data signal.

16. The driver circuit of claim 1 and further comprising a data inversion circuit having an input, a first output connected to the first input of the first control circuit, and a second output connected to the first input of the second control circuit, the data inversion circuit transmitting the data signal to the first control circuit, and an inverted data signal to the second control circuit, the data signal and the inverted data signal having opposite logic states.

17. The driver circuit of claim 16 wherein
the second inputs of the first and second control circuits are connected to the output of the trip point circuit,
the data signal has the first logic state, the inverse data signal has the second logic state, and the output node has a first voltage level, the first control circuit turns off the first output transistor, and the second control circuit turns on the second output transistor; and
when the data signal changes from the first logic state to a second logic state and the inverse data signal changes from the second logic state to the first logic state,
the second control circuit sinks a second current from the second output n channel transistor to turn off the second output transistor.

18. The driver circuit of claim 1 and further comprising:
a first capacitance circuit connected to the first output transistor; and
a second capacitance circuit connected to the second output transistor.

19. A method of operating a driver circuit comprising:
when a data signal has a first logic state and an output node has a first voltage level, turning off an output p-channel transistor, and turning on an output n-channel transistor; and
when the data signal changes from the first logic state to a second logic state,
sinking a first current from a gate of the output p-channel transistor to pull up a voltage on the output node,
reducing a magnitude of the first current sunk from the gate of the output p-channel transistor after the voltage on the output node rises above a trip point voltage; and
sinking a second current from a gate of the output n-channel transistor to turn off the output n-channel transistor.

20. The method of claim 19 wherein when the data signal changes from the second logic state to the first logic state,
sourcing a third current to the gate of the output p-channel transistor to turn off the output p-channel transistor; and
sourcing a fourth current to the gate of the output n-channel transistor to pull down the voltage on the output node, and
reducing a magnitude of the fourth current sourced to the gate of the output n-channel transistor after the voltage on the output node falls below the trip point voltage.

21. The method of claim 19 wherein when the data signal changes from the second logic state to the first logic state,
sourcing a third current to the gate of the output p-channel transistor to turn off the output p-channel transistor; and
sourcing a fourth current to the gate of the output n-channel transistor to pull down the voltage on the output node, and reducing a magnitude of the fourth current sourced to the gate of the output n-channel transistor after the voltage on the output node falls below a different trip point voltage.

22. A driver circuit comprising:

an output driver connected to an output node, the output driver having a first output transistor and a second output transistor, the first output transistor to source current into the output node to raise a voltage on the output node, the second output transistor to sink current from the output node to lower the voltage on the output node;

a trip point circuit having an input connected to the output node, and an output, the trip point circuit having a trip point voltage;

a first control circuit having a first input connected to receive a data signal, a second input connected to the trip point circuit, and a first output connected to the first output transistor; and a second control circuit having a first input, a second input connected to the trip point circuit, and a second output connected to the second output transistor, when the data signal changes from a first logic state to a second logic state while the voltage on the output node lies below the trip point voltage, the first output transistor to source current at a first positive rate into the output node to pull up the voltage on the output node, and at a second positive rate after the voltage on the output node rises above the trip point voltage, the second positive rate being less than the first positive rate.

23. The driver circuit of claim 22 wherein current sourced into the output node from the first output transistor changes from the first positive rate to the second positive rate when the voltage on the output node reaches approximately one-half of a power supply voltage provided to the output driver.

24. The driver circuit of claim 23 wherein the second positive rate is equal to three or more one-way time delays of a conductive line between a first end connected to the output node and a second end connected to a receiver.

25. The driver circuit of claim 23 wherein when the data signal changes from the first logic state to the second logic state while the voltage on the output node lies below the trip point voltage, the second control circuit commands the second output transistor to stop sinking current from the output node.

26. The driver circuit of claim 22 wherein when the data signal changes from the second logic state to the first logic state while the voltage on the output node lies above the trip point voltage, the first output transistor stops sourcing current into the output node; and the second output transistor sinks current at a third positive rate from the output node to pull down the voltage on the output node, and at a fourth positive rate after the voltage on the output node falls below the trip point voltage, the fourth positive rate being less than the third positive rate.

27. The driver circuit of claim 22 wherein the trip point circuit includes a first trip circuit and a second trip circuit, the first trip circuit having an input connected to the output node, an output connected to the second input of the first control circuit, and a first trip point voltage, the second trip circuit having an input connected to the output node, an output connected to the second input of the second control circuit, and a second trip point voltage higher than the first trip point voltage, the first output transistor to source current at the second positive rate after the voltage on the output node rises above the first trip point voltage.

28. The driver circuit of claim 22 and further comprising a data inversion circuit having an input, a first output connected to the first input of the first control circuit, and a second output connected to the first input of the second control circuit, the data inversion circuit transmitting the data signal to the first control circuit, and an inverted data signal to the second control circuit, the data signal and the inverted data signal having opposite logic states.

29. The driver circuit of claim 22 wherein the second inputs of the first and second control circuits are connected to the output of the trip point circuit; and when the data signal has the first logic state and the voltage on the output node lies below the trip point voltage, the first output transistor sources no current into the output node, and the second output transistor sinks current from the output node.

* * * * *

UNITED STATES PATENT AND TRADEMARK OFFICE
CERTIFICATE OF CORRECTION

PATENT NO. : 7,388,404 B1
APPLICATION NO. : 11/493413
DATED : June 17, 2008
INVENTOR(S) : Miller Page 1 of 1

It is certified that error appears in the above-identified patent and that said Letters Patent is hereby corrected as shown below:

Column 28,

Line 25, delete "n channel".

Signed and Sealed this

Twelfth Day of August, 2008

JON W. DUDAS
*Director of the United States Patent and Trademark Office*